(12) United States Patent  (10) Patent No.: US 7,217,323 B2
Sugiyama et al.  (45) Date of Patent: May 15, 2007

(54) EQUIPMENT AND METHOD FOR MANUFACTURING SILICON CARBIDE SINGLE CRYSTAL

(75) Inventors: Naohiro Sugiyama, Nagoya (JP); Yasuo Kitou, Okazaki (JP); Emi Makino, Nagoya (JP); Kazukuni Hara, Kasugai (JP); Kouki Futatsuyama, Kariya (JP); Atsuto Okamoto, Nagoya (JP)

(73) Assignee: Denso Corporation, Kariya (JP)

( * ) Notice: Subject to any disclaimer, the term of this patent is extended or adjusted under 35 U.S.C. 154(b) by 342 days.

(21) Appl. No.: 10/814,179

(22) Filed: Apr. 1, 2004

(65) Prior Publication Data

US 2004/0194694 A1  Oct. 7, 2004

(30) Foreign Application Priority Data

Apr. 4, 2003 (JP) ............................. 2003-102016
May 16, 2003 (JP) ............................. 2003-139387

(51) Int. Cl.
*C30B 25/14* (2006.01)

(52) U.S. Cl. ............................. 117/89; 117/94; 117/95; 117/101; 117/104; 118/715 R

(58) Field of Classification Search .................. 117/89, 117/94, 95, 101, 104; 118/716 R
See application file for complete search history.

(56) References Cited

U.S. PATENT DOCUMENTS 5,704,985 A * 1/1998 Kordina et al. ............. 118/725

| | | | |
|---|---|---|---|
| 6,030,661 A | 2/2000 | Kordina et al. | |
| 6,770,137 B2 | 8/2004 | Hara et al. | |
| 6,830,618 B2 | 12/2004 | Hara et al. | |
| 2002/0056412 A1* | 5/2002 | Hara et al. ..................... | 117/84 |
| 2004/0231583 A1* | 11/2004 | Hara et al. ..................... | 117/89 |

FOREIGN PATENT DOCUMENTS

| JP | A-05-032484 | 2/1993 |
|---|---|---|
| JP | A-2002-362998 | 12/2002 |
| WO | WO 98/14644 | 4/1998 |

OTHER PUBLICATIONS

Notice of Reason for Refusal from Japanese Patent Office issued on Oct. 17, 2006 for the corresponding Japanese patent application No. 2003-102016 (a copy and English translation thereof).

(Continued)

*Primary Examiner*—Robert Kunemund
(74) *Attorney, Agent, or Firm*—Posz Law Group, PLC

(57) ABSTRACT

A method for manufacturing a silicon carbide single crystal includes the steps of: setting a substrate as a seed crystal in a reactive chamber; introducing a raw material gas into the reactive chamber; growing a silicon carbide single crystal from the substrate; heating the gas at an upstream side from the substrate in a gas flow path; keeping a temperature of the substrate at a predetermined temperature lower than the gas so that the single crystal is grown from the substrate; heating a part of the gas, which is a non-reacted raw material gas and does not contribute to crystal growth, after passing through the substrate; and absorbing a non-reacted raw material gas component in the non-reacted raw material gas with an absorber.

42 Claims, 21 Drawing Sheets

OTHER PUBLICATIONS

Notice of Reason for Refusal from Japanese Patent Office Issued on Jun. 6, 2006 for the corresponding Japanese patent application No. 2003-102016 (a copy and English translation thereof).

Notice of Reason for Refusal from Japanese Patent Office issued on Jun. 6, 2006 for the corresponding Japanese patent application No. 2003-139387 (a copy and English translation thereof).

* cited by examiner

FIG. 1A
FIG. 1B
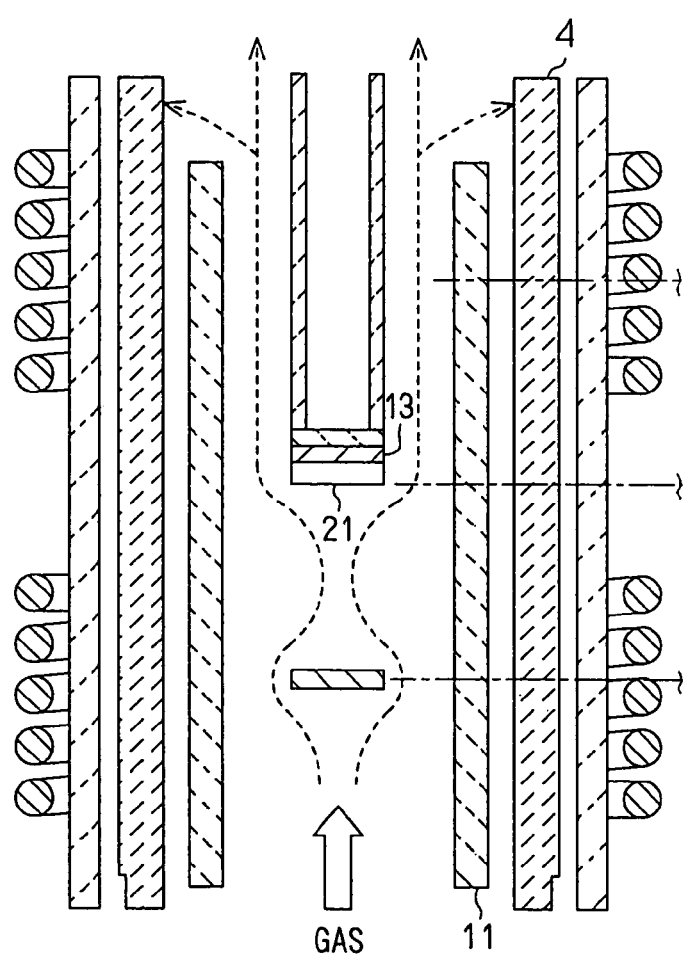
GAS    11
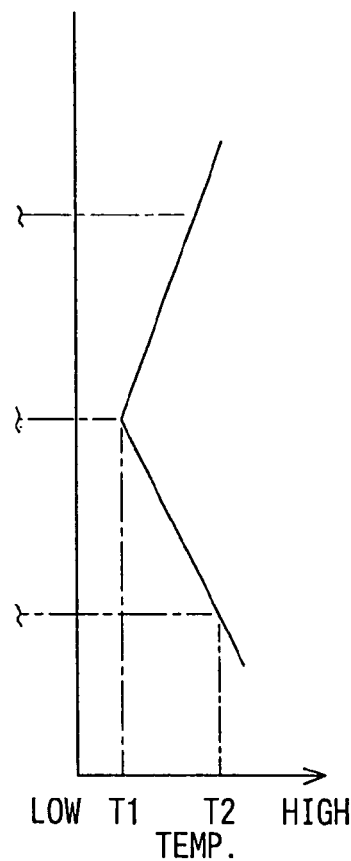
LOW  T1  T2  HIGH
TEMP.

FIG. 2A
FIG. 2B
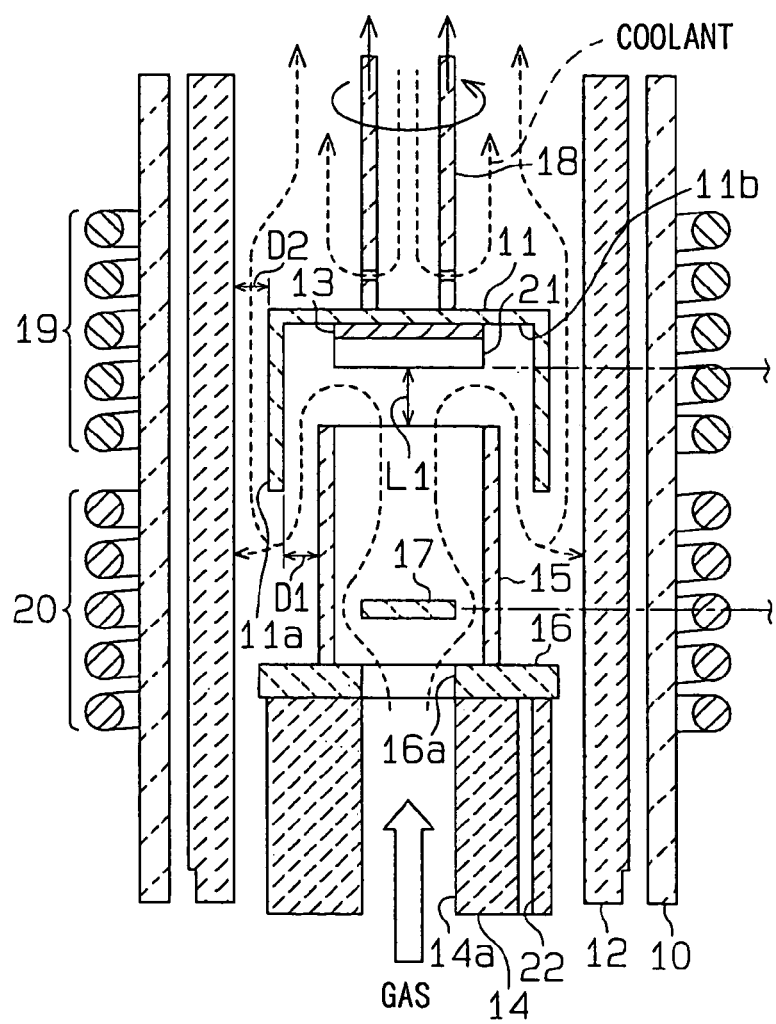
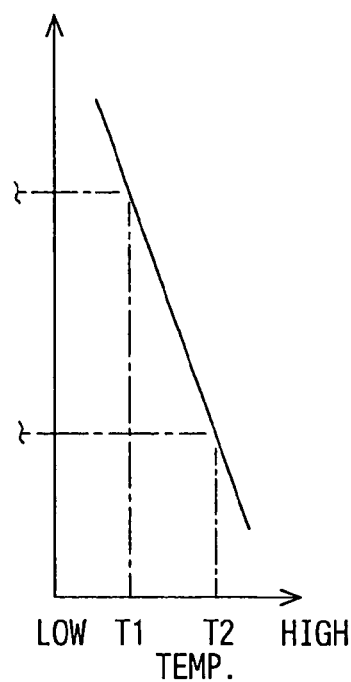

FIG. 11A
FIG. 11B
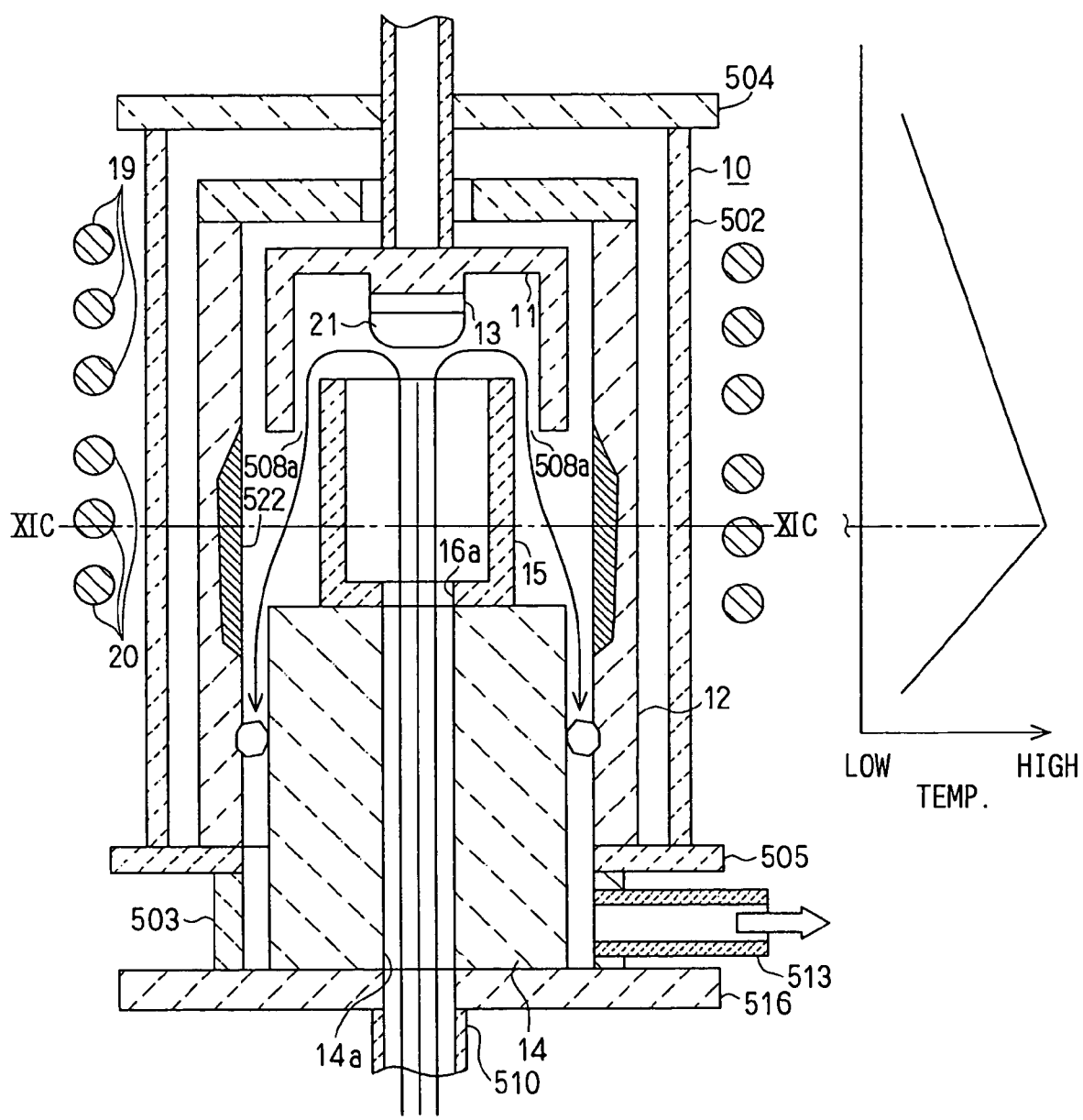
FIG. 11C
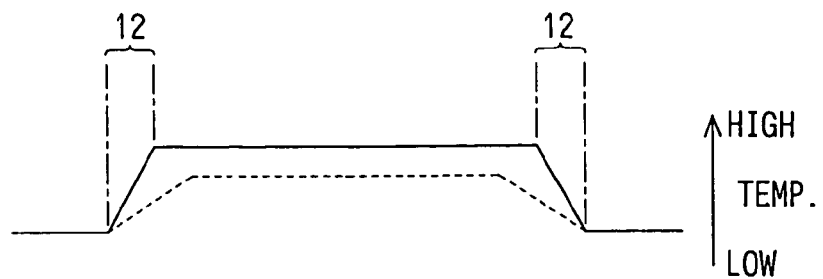

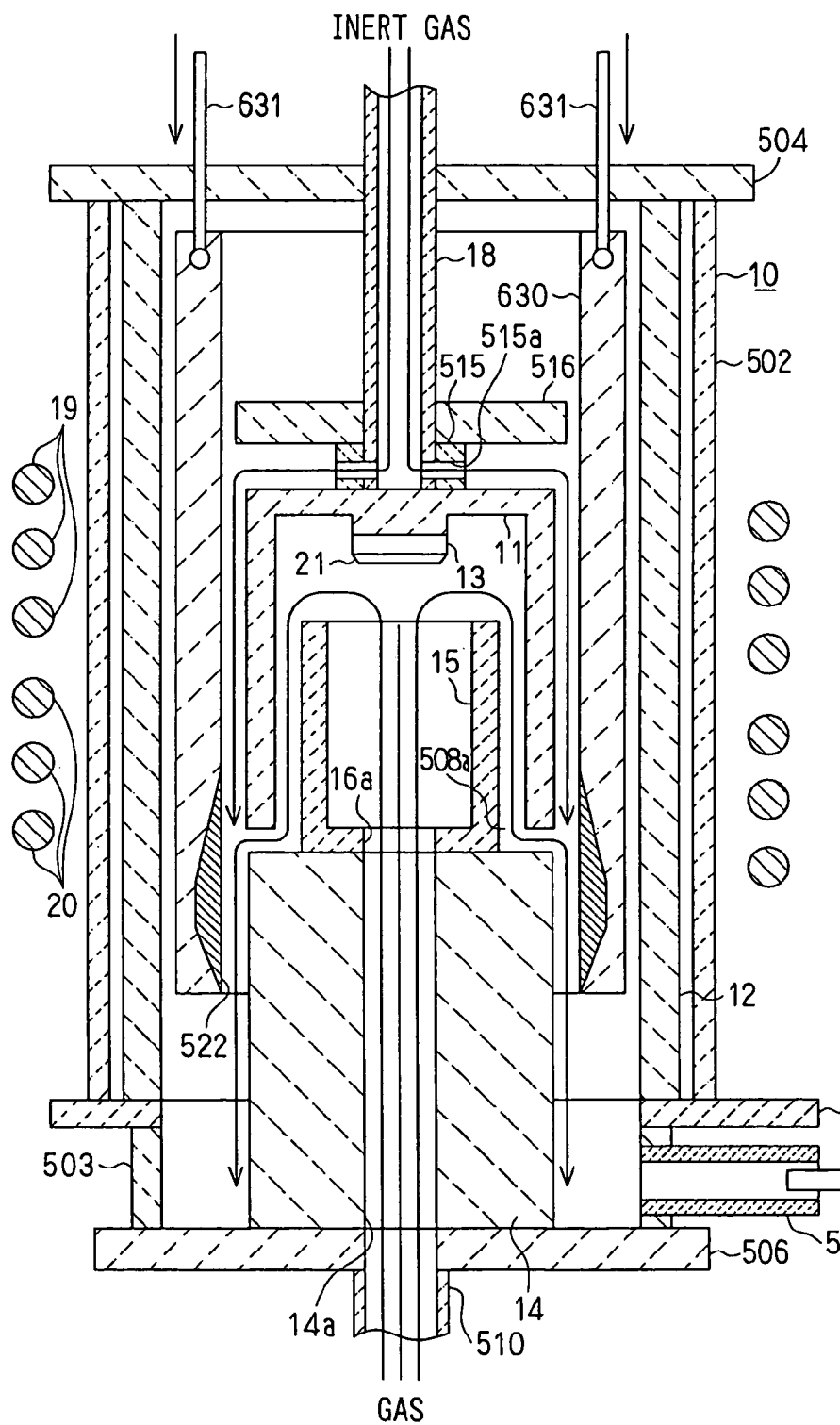

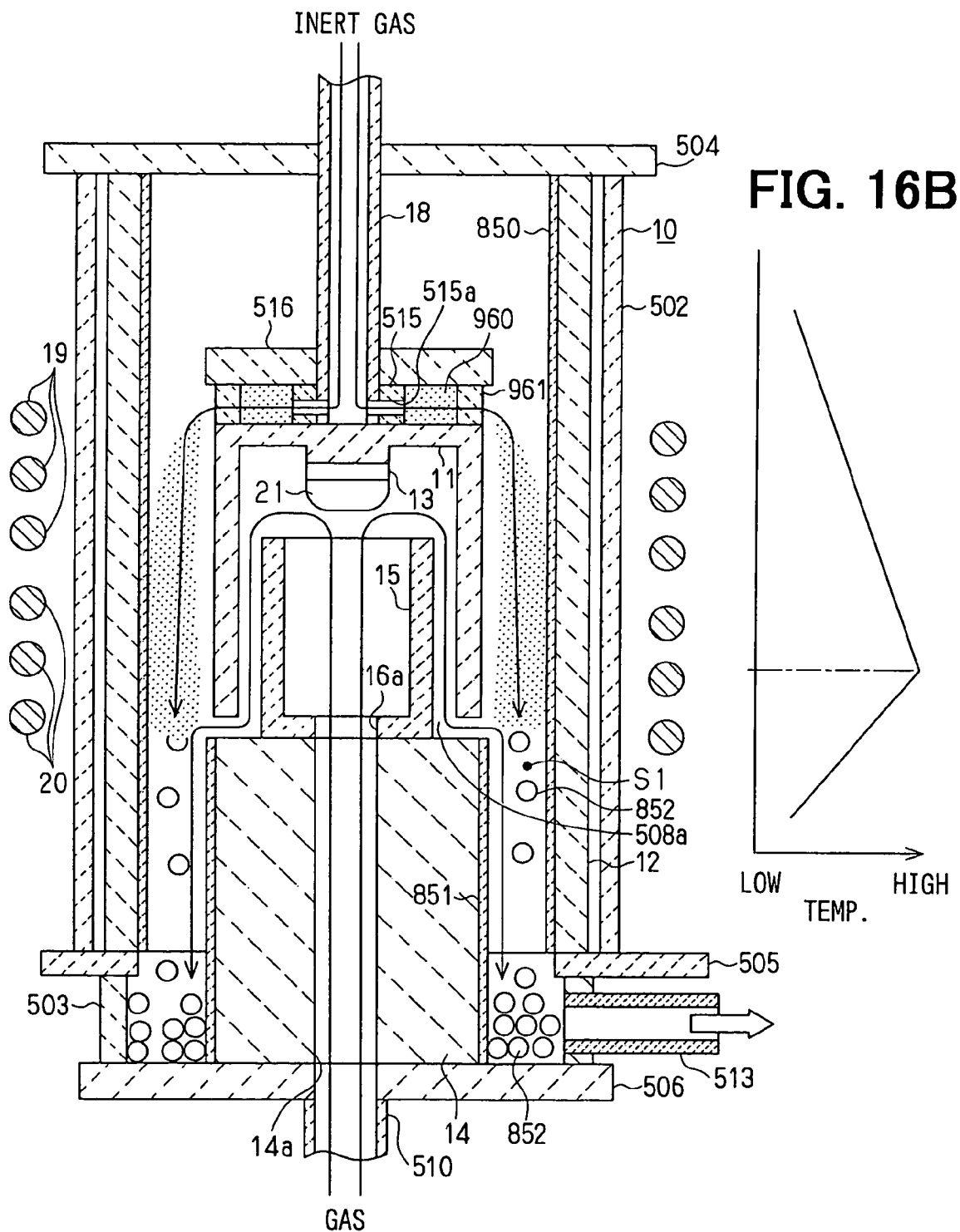

FIG. 17A
FIG. 17B
FIG. 17C
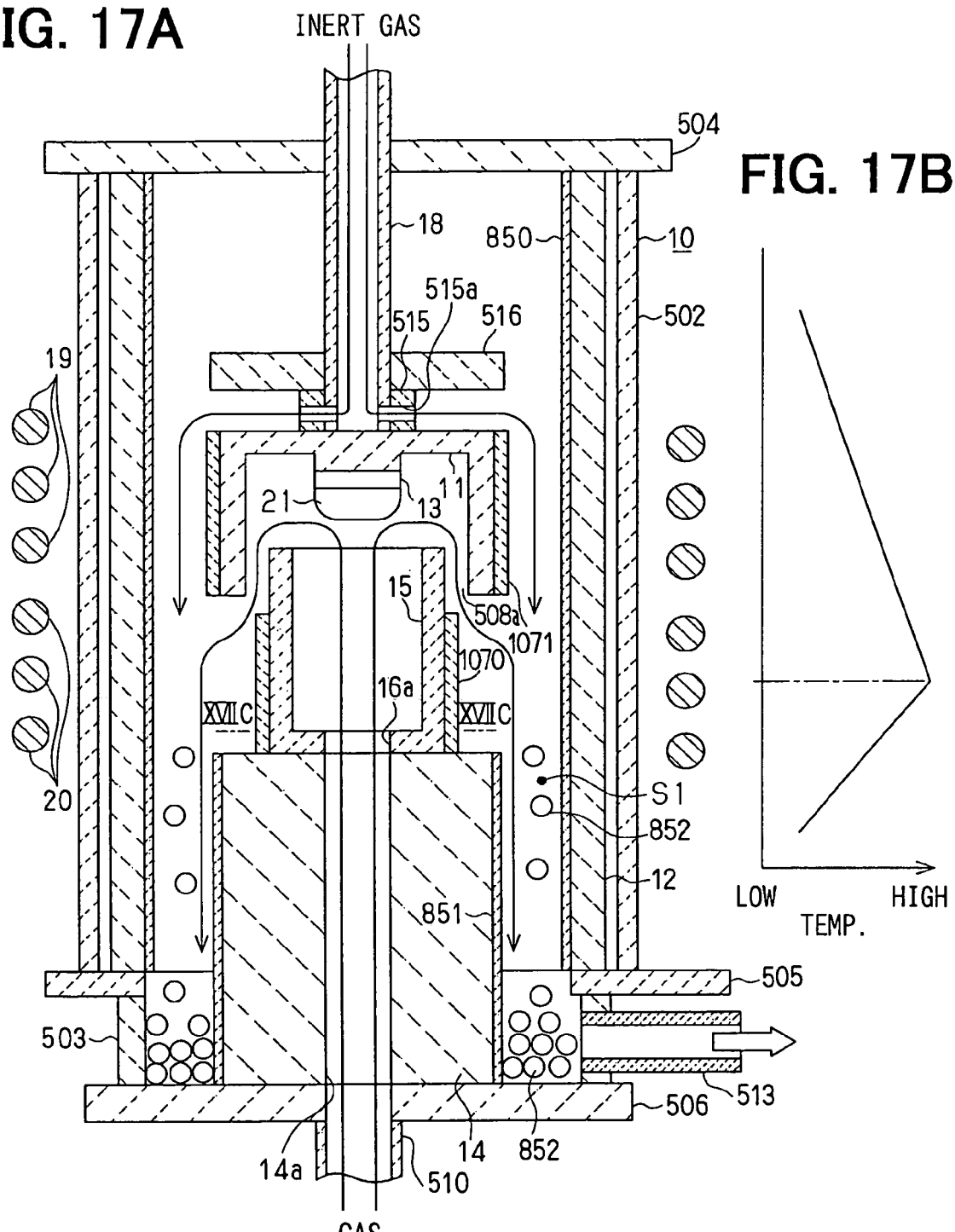
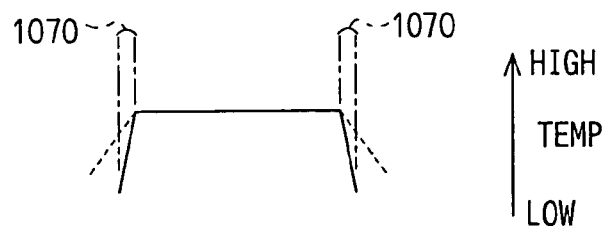

EQUIPMENT AND METHOD FOR MANUFACTURING SILICON CARBIDE SINGLE CRYSTAL

CROSS REFERENCE TO RELATED APPLICATIONS

This application is based on Japanese Patent Applications No. 2003-102016 filed on Apr. 4, 2003, and No. 2003-139387 filed on May 16, 2003, the disclosures of which are incorporated herein by reference.

FIELD OF THE INVENTION

The present invention relates to equipment and a method for manufacturing a silicon carbide single crystal.

BACKGROUND OF THE INVENTION

A silicon carbide single crystal has characteristics of high withstand voltage and high electron mobility. Therefore, the crystal is expected to use for a power device semiconductor substrate. The silicon carbide single crystal is formed by a single crystal growth method referred as a sublimation method (i.e., a modified Lely method).

The modified Lely method is described as follows. A raw material of silicon carbide is disposed in a graphite crucible, which is almost closed and sealed. A seed crystal is mounted on an inner wall of the graphite crucible in such a manner that the seed crystal faces the raw material. The raw material is heated up to a predetermined temperature between 2200° C. and 2400° C. so that a sublimation gas arises. Temperature of the seed crystal is set to be lower than that of the raw material by a predetermined temperature between several tens degrees C. and several hundreds degrees C. so that the sublimation gas is re-crystallized on the seed crystal. Thus, the silicon carbide single crystal is grown.

The modified Lely method has a limitation of amount of the single crystal, which can be grown by the method, since the raw material of the silicon carbide is reduced in accordance with crystal growth of the silicon carbide single crystal. Therefore, even if additional raw material is added during the crystal growth, it is difficult to manufacture the high quality single crystal continuously. That is, because the silicon carbide sublimes in such a manner that a ratio of Si/C in the sublimation gas exceeds 1. When the additional raw material is added during the crystal growth, the concentration of the sublimation gas in the crucible is changed. Therefore, the change of the concentration disturbs to grow the high quality single crystal.

On the other hand, a prior art of epitaxial growth method of silicon carbide by using a CVD (i.e., chemical vapor deposition) method is disclosed in Published Patent Application, Japanese Translation of PCT International Application No. H11-508531 (i.e., U.S. Pat. No. 5,704,985). FIGS. 20 and 21 are schematic cross sectional views showing manufacturing equipment according to the prior art. As shown in FIG. 20, a susceptor 101 is disposed in a center of a casing 100. The casing 100 and the susceptor 101 are cylinders, respectively. The susceptor 101 is made of high purity graphite and the like. A silicon carbide single crystal substrate 102 as a seed crystal is disposed on an upper end of the susceptor 101. A heating means 103 is disposed outside of the casing 100 at a predetermined position, which corresponds to an outer periphery of the susceptor 101. The heating means 103 heats a raw material gas. Outside around the susceptor 101 is filled with porous graphite 104 as a heat insulation. A passage 105 having a funnel shape is formed in the heat insulation (104). The passage 105 is disposed on a lower end of the susceptor 101. A raw material gas introduction pipe 106 is disposed on a lower end of the casing 100. The pipe 106 supplies the raw material gas including Si and C, which are necessitated for the crystal growth of the silicon carbide single crystal. Another passage 107 is disposed on the upper end of the susceptor 101. The passage 107 is used for discharging the raw material gas. An outlet passage 108 is disposed on an upper portion of the casing 100. The outlet passage 108 connects to an outside of the casing 100. In the manufacturing equipment having the above construction, the raw material gas supplied through the raw material gas introduction pipe 106 passes through the passage 105 formed in the heat-insulation (104). Then, the gas is led into the susceptor 101, and then the gas is heated by the heating means 103. Thus, the silicon carbide single crystal is grown from the seed crystal (i.e., the substrate 102) by the epitaxial growth method. After that, a residual raw material gas passes through the passage 107 disposed on the upper end of the susceptor 101 and passes through the outlet passage 108 disposed on the upper portion of the casing 100, so that the gas is discharged.

Further, another equipment is disclosed in the prior art, as shown in FIG. 21. In FIG. 21, a growth space is provided by a susceptor 200 and a cover 201. The susceptor 200 has a circumference wall. The raw material gas as a raw material is introduced into the growth space so that a crystal growth is performed at a predetermined temperature, at which the substrate 202 begins to sublime. A part of the raw material gas, which does not contribute to the crystal growth, is discharged to the outside of the equipment through a gas outlet 203.

In the method shown in FIGS. 20 and 21, a ratio of Si/C can be kept at a constant ratio during the crystal growth. Therefore, the single crystal having high quality can be grown with a high speed growth rate.

However, in the above method, the whole susceptors 101, 200 are heated at the same temperature, respectively (i.e., the susceptor 101, 200 is heated uniformly). Therefore, the raw material gas introduced into the growth space deposits the single crystal not only on the substrate but also on the inner wall of the susceptors 101, 200. Therefore, when a single crystal having a long length is required to obtain, a growth yield of the single crystal becomes smaller. Further, the growth space and/or the gas outlet (i.e., the passage 107 or the gas outlet 203) are closed with the deposited crystal (that is not unexpected to deposit around the gas outlet), so that the crystal growth cannot be performed stationary. Further, a part of the raw material gas of the silicon carbide, which does not contribute to the crystal growth, discharges to the outside of the susceptors 101, 200, so that the silicon carbide is deposited in discharge passages (i.e., the outlet passage 108 or the gas outlet 203). Therefore, the discharge passage may be plugged so that the crystal growth cannot be performed stationary.

Further, a part of the raw material gas (a non-reacted raw material gas), which does not contribute to crystal growth in the susceptor 101, is absorbed in the heat-insulation 104, so that a poly crystalline silicon carbide is deposited. Therefore, heat insulation performance of the heat insulation 104 is deteriorated. That deterioration may cause an emission path such as the passage 107 and the outlet passage 108 to be plugged. Then, supply of the raw material gas stops so that the continuous crystal growth is prevented.

SUMMARY OF THE INVENTION

In view of the above-described problem, it is an object of the present invention to provide a method and equipment for manufacturing a silicon carbide single crystal. Specifically, the method and the equipment perform to continue crystal growth effectively and stationary so that high quality single crystal is obtained.

A method for manufacturing a silicon carbide single crystal includes the steps of: setting a silicon carbide single crystal substrate as a seed crystal in a reactive chamber; introducing a raw material gas including a silicon containing gas and a carbon containing gas into the reactive chamber; growing a silicon carbide single crystal from the silicon carbide single crystal substrate; heating the raw material gas at an upstream side from the silicon carbide single crystal substrate in a gas flow path; keeping a temperature of the silicon carbide single crystal substrate at a predetermined temperature lower than the raw material gas so that the silicon carbide single crystal is grown from the silicon carbide single crystal substrate; heating a part of the raw material gas, which is a non-reacted raw material gas and does not contribute to crystal growth, after passing through the silicon carbide single crystal substrate; and absorbing a non-reacted raw material gas component in the non-reacted raw material gas with an absorber.

In the above method, in the raw material gas flow, the single crystal is deposited on the silicon carbide single crystal substrate as the seed crystal at the low temperature, at which supersaturated gas is provided. Further, the crystal is not deposited on the upstream side and downstream side from the substrate since the upstream and downstream sides have high temperatures, at which unsaturated gas is provided. As a result, the growth yield of the silicon carbide single crystal is improved compared with the prior method that provides to uniform the temperature of the gas flow path. Further, the reactive chamber (i.e., the growth space) is prevented from being plugged by the deposited crystal.

Furthermore, the raw material gas, which does not contribute to the crystal growth, is absorbed with the absorber. Other gases except for the raw material gas is introduced to the emission system. Therefore, the gas flow path is prevented from being plugged. As a result, the gas flow path including the reactive chamber (i.e., the growth space) is not plugged with the deposited crystal, so that the crystal growth is performed stationary.

Preferably, the part of the raw material gas has a second gas flow opposite to a first gas flow of the raw material gas flowing toward the silicon carbide single crystal substrate. In this case, the introduced raw material gas flow is reversed at the silicon carbide single crystal substrate as the seed crystal. Therefore, the raw material gas becomes supersaturated at the silicon carbide single crystal substrate, which is kept at the low temperature, and becomes unsaturated at a heating state of the raw material gas.

Preferably, the temperature of the silicon carbide single crystal substrate is lowered to be lower than temperature around the silicon carbide single crystal substrate. In this case, the temperature of the substrate is locally lowered in the reactive chamber compared with a periphery of the silicon carbide single crystal substrate as the seed crystal. Therefore, only the temperature of the silicon carbide single crystal substrate as the seed crystal can be locally lowered so that the growth yield of the single crystal is improved. Further, the single crystal can be separated from a poly crystal deposited on the periphery, so that the single crystal having high quality is grown appropriately.

Preferably, the method further includes the step of stirring the raw material gas in the step of heating the raw material gas at the upstream side before the raw material gas is introduced to the silicon carbide single crystal substrate. In a case where the raw material gas is heated at the upstream side from the silicon carbide single crystal substrate as the seed crystal before the raw material gas is introduced to the silicon carbide single crystal substrate as the seed crystal, the raw material gas is stirred. Therefore, the raw material gas in the reactive chamber (i.e., the growth space) is promoted to stir, so that the growth yield of the single crystal is improved.

Further, a method for manufacturing a silicon carbide single crystal includes the steps of: mounting a reactive chamber in a vacuum chamber in such a manner that the reactive chamber is surrounded by a heat insulation of the vacuum chamber; setting a silicon carbide single crystal substrate as a seed crystal in the reactive chamber; introducing a raw material gas including a silicon containing gas and a carbon containing gas into the reactive chamber; growing a silicon carbide single crystal from the silicon carbide single crystal substrate; discharging a part of the raw material gas, which is a non-reacted raw material gas and does not contribute to crystal growth, after passing through the silicon carbide single crystal substrate; and removing a non-reacted raw material gas component in the non-reacted raw material gas in such a manner that the non-reacted raw material gas component is converted from a gas state to a solid state in the vacuum chamber before the non-reacted raw material gas component is absorbed in the heat insulation.

In the above method, the non-reacted raw material gas is suppressed from absorbing into the heat insulation. Thus, the deterioration of the heat insulation performance of the heat insulation is improved so that the crystal growth is stabilized. Further, it is limited that the non-reacted raw material gas is cooled so that the crystal is deposited and then the passage is plugged in a gas path discharged from the reactive chamber. Thus, the raw material gas is stably supplied. With respect to the above effect, the high quality single crystal is manufactured.

Further, equipment for manufacturing a silicon carbide single crystal includes a reactive chamber for accommodating a silicon carbide single crystal substrate as a seed crystal, wherein a raw material gas including a silicon containing gas and a carbon containing gas is introduced into the reactive chamber so that a silicon carbide single crystal is grown from the silicon carbide single crystal substrate; a heater for heating the raw material gas to be introduced to the silicon carbide single crystal substrate up to a temperature higher than a temperature of the silicon carbide single crystal substrate; and an absorber (i.e., a carbon heat insulation). The reactive chamber has a construction in such a manner that a part of the raw material gas, which is a non-reacted raw material gas and does not contribute to crystal growth, flows toward a downstream side from the silicon carbide single crystal substrate after passing through the silicon carbide single crystal substrate. The heater heats the part of the raw material gas after passing through the silicon carbide single crystal substrate. The absorber absorbs a non-reacted raw material gas component in the non-reacted raw material gas after heating the part of the raw material gas.

Preferably, the reactive chamber has a predetermined temperature gradient in such a manner that a temperature in the reactive chamber is reduced as it goes toward the silicon carbide single crystal substrate.

In the above equipment, since the reactive chamber has the predetermined temperature gradient in such a manner that the temperature in the reactive chamber is reduced as it goes toward the silicon carbide single crystal substrate as the seed crystal, the raw material gas flow is reversed at the substrate and then the gas flows along with the inner wall of the chamber after the raw material gas contributes to deposit the crystal on the silicon carbide single crystal substrate as the seed crystal. Here, the temperature of the substrate becomes the lowest. The reversed raw material gas becomes unsaturated near the inner wall of the chamber, the temperature of which is higher than that of the silicon carbide single crystal substrate. Therefore, the reversed raw material gas is discharged to the outside of the chamber without depositing the crystal on the inner wall of the chamber.

More preferably, the equipment further includes a tube for introducing the raw material gas toward the reactive chamber. The reactive chamber is separated from the tube. In this case, heat conduction is intercepted, so that the temperature difference between the tube of the heater and the reactive chamber can be set larger. If the temperature difference is large, degree of super saturation of the gas at the silicon carbide single crystal substrate as the seed crystal becomes larger. Thus, the growth yield of the crystal growth becomes higher.

Preferably, the equipment further includes a hydrogen separation film disposed on an outlet of the reactive chamber. The hydrogen separation film passes a hydrogen gas only. In this case, when the raw material gas introduced into the reactive chamber (i.e., the growth space) is discharged, the gas is filtered through the hydrogen separation film for passing only hydrogen gas. Therefore, only the hydrogen gas is selectively discharged. Thus, the raw material gas, which does not contribute to the crystal growth, is reused, so that the introduced raw material gas contributes to the crystal growth with high efficiency. Specifically, in the method of the prior art, the contribution rate of the raw material, which contributes to the crystal growth of the single crystal becomes small, so that the raw material efficiency becomes low. However, the above method and equipment resolve the problem of the low efficiency, so that the raw material efficiency is improved.

Further, equipment for manufacturing a silicon carbide single crystal includes a reactive chamber disposed in a vacuum chamber; a heat insulation for surrounding the reactive chamber; a silicon carbide single crystal substrate as a seed crystal disposed in the reactive chamber; a tube for introducing a raw material gas including a silicon containing gas and a carbon containing gas into the reactive chamber so that a silicon carbide single crystal is grown from the silicon carbide single crystal substrate; and an absorber disposed between an outlet of the reactive chamber and a heat insulation of the vacuum chamber. A non-reacted raw material gas component in a non-reacted raw material gas, which does not contribute to crystal growth, is converted from a gas state to a solid state so that the non-reacted raw material gas component is absorbed in the absorber.

In the above equipment, the equipment includes an absorber disposed between the outlet of the reactive chamber for the non-reacted raw material gas and the heat insulation in the vacuum chamber. The non-reacted raw material gas discharged from the reactive chamber is converted from a gas state to a solid state so that the gas is absorbed in the absorber. Thus, the non-reacted raw material gas discharged from the reactive chamber is converted from a gas state to a solid state so that the gas is absorbed in the absorber disposed between the outlet of the reactive chamber for the non-reacted raw material gas and the heat insulation.

Preferably, the absorber is displaced during crystal growth so that a portion of the absorber for absorbing the non-reacted raw material gas component is changed. More preferably, the equipment further includes a heater for heating the raw material gas to be introduced into the reactive chamber. The raw material gas is heated up to a maximum temperature before introducing into the reactive chamber. The silicon carbide single crystal substrate has a temperature lower than the maximum temperature so that the silicon carbide single crystal is grown from the silicon carbide single crystal substrate. The absorber is displaced in a moving direction, to which a portion of the absorber absorbed the non-reacted raw material gas component leaves from a portion of the maximum temperature in the vacuum chamber so that a temperature of the portion of the absorber is lowered. In this case, the absorbed material is prevented from subliming (i.e., vaporizing). Furthermore preferably, the moving direction of the absorber is a direction, to which the portion of the absorber absorbed the non-reacted raw material gas component leaves from the silicon carbide single crystal substrate through the portion of the maximum temperature in the vacuum chamber. In this case, the absorber does not cross the direction leaving from the seed crystal. Specifically, the absorber does not cross the growth space and it's around. Therefore, the temperature distribution in the growth space is not affected. Thus, the crystal growth condition can be prepared stably so that the quality of the crystal is improved.

Further, equipment for manufacturing a silicon carbide single crystal includes a reactive chamber disposed in a vacuum chamber; a heat insulation for surrounding the reactive chamber; a silicon carbide single crystal substrate as a seed crystal disposed in the reactive chamber; a tube for introducing a raw material gas including a silicon containing gas and a carbon containing gas into the reactive chamber so that a silicon carbide single crystal is grown from the silicon carbide single crystal substrate; a space for separating out a non-reacted raw material gas component in a non-reacted raw material gas, which does not contribute crystal growth. The space is disposed in a place, temperature of which is gradually reduced. The space is surrounded by the heat insulation disposed in a gas flow path in the vacuum chamber, the gas flow path being disposed from an outlet of the reactive chamber to an emission pipe in the vacuum chamber for discharging the non-reacted raw material gas.

In the above equipment, the temperature of the non-reacted raw material gas discharged from the reactive chamber is reduced in the space in the gas flow path surrounded by the heat insulation disposed downstream from the outlet of the reactive chamber for the non-reacted raw material gas. Thus, the non-reacted raw material gas deposits the crystal.

Preferably, the equipment further includes an inert gas pipe for introducing an inert gas toward the emission pipe in the vacuum chamber. More preferably, the inert gas including a crystal core is spread in the space.

Preferably, the heat insulation for surrounding the space includes an air-tight sheet disposed on a surface of the heat insulation.

Further, equipment for manufacturing a silicon carbide single crystal includes a reactive chamber disposed in a vacuum chamber; a heat insulation for surrounding the reactive chamber; a silicon carbide single crystal substrate as a seed crystal disposed in the reactive chamber; a tube for introducing a raw material gas including a silicon containing gas and a carbon containing gas into the reactive chamber so that a silicon carbide single crystal is grown from the silicon carbide single crystal substrate; and a separator for separating out a non-reacted raw material gas component in a non-reacted raw material gas, which does not contribute to crystal growth. The separator is disposed in a part of a gas flow path in the vacuum chamber, the part of the gas flow path being disposed from an outlet of the reactive chamber to an emission pipe in the vacuum chamber. The emission pipe discharges the non-reacted raw material gas. The part of the gas flow path has a temperature being gradually reduced. The non-reacted raw material gas component in the non-reacted raw material gas is separated out in a space surrounded by another heat insulation in the separator.

In the above equipment, the temperature of the non-reacted raw material gas discharged from the reactive chamber is gradually reduced in the space surrounded by the heat insulation in the separator disposed on a downstream side of the gas flow path from the outlet of the reactive chamber for the non-reacted raw material gas. Therefore, the non-reacted raw material gas component is separated out.

BRIEF DESCRIPTION OF THE DRAWINGS

The above and other objects, features and advantages of the present invention will become more apparent from the following detailed description made with reference to the accompanying drawings. In the drawings:

FIG. 1A is a schematic cross sectional view showing outline of equipment for manufacturing a silicon carbide single crystal, and FIG. 1B is a graph showing a relationship between a position and temperature in the equipment, according to a first embodiment of the present invention;

FIG. 2A is a schematic cross sectional view showing the equipment, and FIG. 2B is a graph showing a relationship between a position and temperature in the equipment, according to a second embodiment of the present invention;

FIG. 11A is a schematic cross sectional view showing equipment for manufacturing a silicon carbide single crystal as a comparison, FIG. 11B is a graph showing a relationship between a position and temperature in the equipment, and FIG. 11C is a graph showing a temperature profile disposed on line XIC—XIC in FIG. 11A, according to the sixth embodiment;

FIG. 12A is a schematic cross sectional view showing equipment for manufacturing a silicon carbide single crystal, and FIG. 12B is a graph showing a relationship between a position and temperature in the equipment, according to a seventh embodiment of the present invention;

FIG. 16A is a schematic cross sectional view showing equipment for manufacturing a silicon carbide single crystal, and FIG. 16B is a graph showing a relationship between a position and temperature in the equipment, according to a tenth embodiment of the present invention;

FIG. 17A is a schematic cross sectional view showing equipment for manufacturing a silicon carbide single crystal, FIG. 17B is a graph showing a relationship between a position and temperature in the equipment, and FIG. 17C is a graph showing a temperature profile disposed on line XVIIC—XVIIC in FIG. 17A, according to an eleventh embodiment of the present invention;

DETAILED DESCRIPTION OF THE PREFERRED EMBODIMENTS

First Embodiment

Figure 3A:
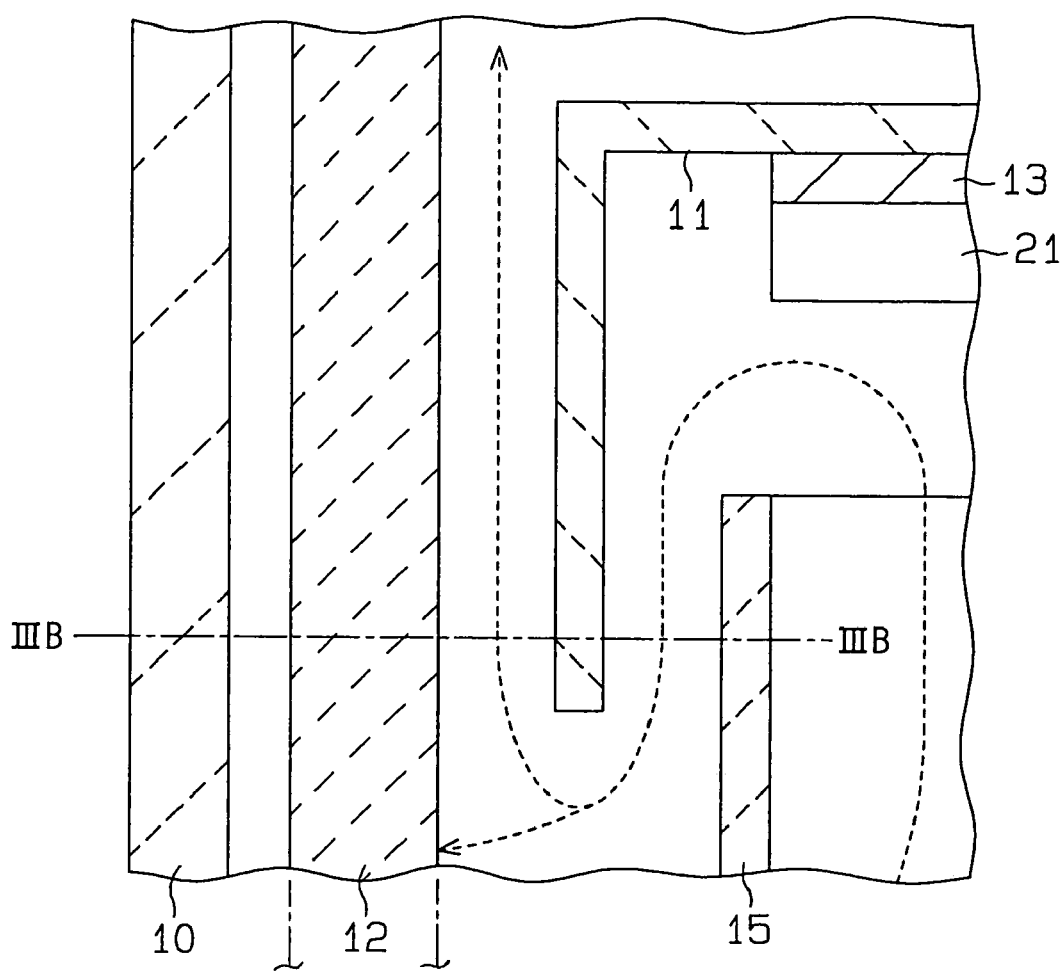
FIG. 3A is an enlarged cross sectional view showing a part of the equipment.

A first embodiment of the present invention is described with reference to the drawings.

FIG. 1A is a schematic cross sectional view showing outline of equipment for manufacturing a silicon carbide single crystal, and FIG. 1B is a graph showing a relationship between a position and temperature in the equipment, according to a first embodiment of the present invention. FIGS. 1A and 1B explain a function of a method of the first embodiment. The method for manufacturing the silicon carbide single crystal shown in FIGS. 1A and 1B includes the steps of: setting a silicon carbide single crystal substrate 13 as a seed crystal in a reactive chamber 11; introducing a raw material gas including a silicon containing gas and a carbon containing gas into the reactive chamber 11; and growing a silicon carbide single crystal 21 from the silicon carbide single crystal substrate 13 as the seed crystal. The method is characterized in that the raw material gas is heated at an upstream side from the silicon carbide single crystal substrate 13 as the seed crystal in a raw material gas flow; the silicon carbide single crystal substrate 13 as the seed crystal is kept at low temperature lower than the raw material gas so that crystal growth is occurred from the substrate 13; and a part of the raw material gas, which does not contribute to the crystal growth, is heated again after passing through the substrate 13, and then absorbed with a absorber 4.

Thus, in the raw material gas flow, the single crystal 21 is deposited on the silicon carbide single crystal substrate 13 as the seed crystal at the low temperature, at which supersaturated gas is provided. Further, the single crystal 21 is not deposited on the upstream side and downstream side from the substrate 13 since the upstream and downstream sides have high temperatures, at which unsaturated gas is provided. As a result, the growth yield of the silicon carbide single crystal 21 is improved compared with the prior method shown in FIGS. 20 and 21 that provides to uniform the temperature of the gas flow path. Further, the reactive chamber 11 (i.e., the growth space) is prevented from being plugged by the deposited crystal.

Furthermore, the raw material gas, which does not contribute to the crystal growth, is absorbed with the absorber 4. Residual gas except for the raw material gas is introduced to an emission system. Therefore, the gas flow path is prevented from being plugged. As a result, the gas flow path including the reactive chamber 11 (i.e., the growth space) is not plugged with the deposited crystal, so that the crystal growth is performed stationary.

Preferably, the temperature of the raw material gas heated at the upstream side from the silicon carbide single crystal substrate 13 as the seed crystal is in a range between 2300° C. and 2700° C. (i.e., T2 shown in FIG. 1B), and the temperature of the growth surface of the silicon carbide single crystal 21 is in a range between 2100° C. and 2600° C. (i.e., T1 shown in FIG. 1B), as shown in FIG. 1B.

Second Embodiment

FIG. 2A is a schematic cross sectional view showing manufacturing equipment of a silicon carbide single crystal, according to a second embodiment of the present invention.

As shown in FIG. 2A, a vacuum chamber 10 is a cylinder, and disposed in a standing manner. The vacuum chamber 10 is made of, for example, quartz. A reactive chamber 11 is disposed in a standing manner inside the vacuum chamber 10. The reactive chamber 11 is a cylinder having a cover. The reactive chamber 11 is made of graphite. The reactive chamber 11 is composed of a cylinder 11a having a cylindrical shape and a cover 11b for covering an upper opening of the cylinder 11a (i.e., a lower end of the cylinder 11a is opened). A silicon carbide single crystal substrate 13 is mounted on the bottom of the cover 11b of the reactive chamber 11. The silicon carbide single crystal substrate 13 works as a seed crystal so that a silicon carbide single crystal 21 is deposited in the reactive chamber 11.

In the vacuum chamber 10, a heat-insulation 14 is disposed under the reactive chamber 11. A raw material gas supply passage 14a is disposed in the heat insulation 14. The raw material gas is supplied from the raw material gas supply passage 14a toward the reactive chamber 11 disposed upside of the passage 14a. The raw material gas is, for example, a mixture of monosilane gas (which includes Si), propane gas (which includes C) and carrier gas, all of which are mixed at predetermined proportions.

In the vacuum chamber 10, a tube 15 is disposed in a standing manner, and disposed upside of the heat insulation (i.e., a raw material gas supply) 14. The tube 15 is a cylinder, and a plate 16 is disposed on a lower opening of the tube 15. The plate 16 covers the lower opening of the tube 15. A through hole 16a for passing the raw material gas therethrough is formed in a center portion of the plate 16. The raw material gas introduced from the raw material gas supply passage 14a of the heat insulation 14 is introduced inside of the tube 15 through the through hole 16a of the plate 16. The tube 15 is made of graphite. Preferably, the tube 15 is made of the graphite covered with tantalum carbide for preventing a reaction between the graphite and the raw material gas.

The tube 15 is disposed under a lower opening of the reactive chamber 11. The reactive chamber 11 and the tube 15 have a certain relationship of positioning. Specifically, the reactive chamber 11 having a cylindrical shape with a cover is capped on the tube 15 from the lower opening side of the reactive chamber 11. In this arrangement, an outer circumference of the tube 15 and an inner circumference of the cylinder 11a of the reactive chamber 11 are separated by a predetermined distance D1. Specifically, the distance D1 is in a range between 1 mm and 50 mm. Further, an upper end of the tube 15 and the cover 11b of the reactive chamber 11 are separated.

A disturbance plate 17 is disposed in the tube 15, and extends in a horizontal direction. A center of the silicon carbide single crystal substrate (i.e., the seed crystal) 13 coincides to a center of the disturbance plate 17 and a center of the raw material gas supply passage 14a of the heat insulation 14. The raw material gas hits the disturbance plate 17 so that heat exchange between the raw material gas and the disturbance plate 17 is promoted. The plate 16 and the disturbance plate 17 are made of tantalum carbide or graphite covered with tantalum carbide.

A pipe 18 is fixed and mounted on the upper surface of the cover 11b of the reactive chamber 11 so that the pile 18 connects to and supports the reactive chamber 11. Here, a lower end of the pipe 18 adheres to the upper surface of the cover 11b. The pipe 18 extends in a vertical direction. A system (not shown) for rotating and elevating the reactive chamber 11 up and down is disposed on an upper end of the pipe 18. The system rotates and elevates the pipe 18 up and down (i.e., moves the pipe 18 up and down). Specifically, when the silicon carbide single crystal substrate (i.e., the seed crystal) 13 is disposed in the reactive chamber 11, the pipe 18 is rotated or elevated up and down during the crystal growth so that the silicon carbide single crystal substrate (i.e., the seed crystal) 13 is rotated and elevated up and down. A coolant gas is introduced through the pipe 18 for supporting the reactive chamber 11, and then discharged to the outside of the pipe 18 through the through hole disposed on the lower end of the pipe 18. Thus, the gas for cooling is introduced to a backside of the cover 11b of the reactive chamber 11 so that heat exchange between the coolant gas and the reactive chamber 11 (i.e., the cover 11b) is performed in accordance with passing the coolant gas through. Therefore, the cover 11b is cooled, so that the temperature of the silicon carbide single crystal substrate 13 as the seed crystal is lowered, compared with a periphery of the substrate 13.

As shown in FIG. 2A, a high frequency induction coil (i.e., RF coil) 19 is wound on the outer circumference of the vacuum chamber 10. The RF coil 19 is disposed at a predetermined height, which corresponds to a height of the silicon carbide single crystal substrate (i.e., the seed crystal) 13 when the silicon carbide single crystal 21 is grown. The RF coil 19 is energized so that the silicon carbide single crystal substrate (i.e., the seed crystal) 13 is heated during the crystal growth.

Another high frequency induction coil (i.e., RF coil) 20 is wounded on the outer circumference of the vacuum chamber 10. The RF coil 20 is disposed under the high frequency induction coil 19. The RF coil 20 is energized so that the raw material gas passing through the tube 15 is heated.

In this embodiment, a heater (i.e., high frequency induction type heater equipment) is composed of the high frequency induction coil (i.e., the RF coil) 20, the tube 15, the plate 16 and the disturbance plate 17. The heater heats the raw material gas to be introduced to the silicon carbide single crystal substrate 13 as the seed crystal up to a temperature higher than that of the silicon carbide single crystal substrate 13 as the seed crystal. Specifically, the high frequency induction coil (i.e., RF coil) 20 is prepared independently from the high frequency induction coil (i.e., RF coil) 19. Therefore, the temperature of the raw material gas to be supplied to the silicon carbide single crystal substrate (i.e., the seed crystal) 13 can be controlled independently from the temperature of the silicon carbide single crystal substrate 13.

Further, the reactive chamber 11 has the certain construction, which provides to return the part of the raw material gas to the upstream side from the substrate 13 after the single crystal 21 is grown on the silicon carbide single crystal substrate 13 as the seed crystal by using the raw material gas heated with the heater (15, 16, 17, 20). Here, the part of the raw material gas does not contribute to the crystal growth, i.e., the part of the raw material gas is a non-reacted raw material gas. In detail, as shown in a temperature distribution in a vertical direction in FIG. 2B, the reactive chamber 11 has a temperature gradient in such a manner that the temperature in the reactive chamber 11 is reduced toward the silicon carbide single crystal substrate 13 as the seed crystal. After the raw material gas reaches the silicon carbide single crystal substrate 13 as the seed crystal in the reactive chamber 11, the raw material gas is discharged along with the inner wall of the reactive chamber 11. Specifically, the raw material gas is introduced in the center of the reactive chamber 11 from the opening of the reactive chamber 11 having the cylindrical shape with the cover, and then the gas reaches the silicon carbide single crystal substrate 13 as the seed crystal. After that, the gas returns to the upstream side along with the inner wall of the reactive chamber 11. Then, the gas flows from the opening of the reactive chamber 11 to the downstream side.

Figure 3B:
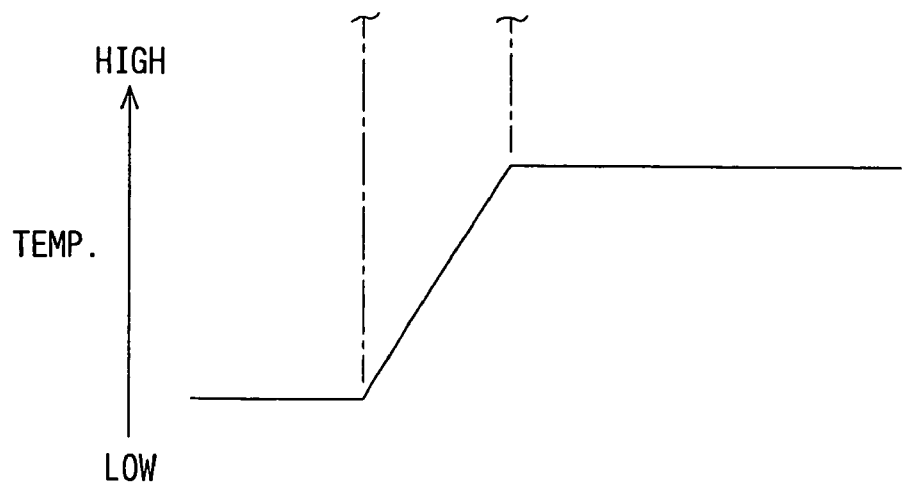
FIG. 3B is a graph showing a temperature profile disposed on line IIIB—IIIB in FIG. 3A, according to the second embodiment.

On the other hand, a carbon heat insulation 12 is disposed on the inner wall of the vacuum chamber 10, as shown in FIG. 3A. Here, the temperature profile disposed on line IIIB—IIIB is shown in FIG. 3B. As shown in FIG. 3B, the carbon heat insulation 12 works as a heat insulation. The inner circumference of the carbon heat insulation 12 and the outer circumference of the reactive chamber 11 having the cylindrical shape are separated at a predetermined distance D2. Specifically, the distance D2 is in a range between 1 mm and 50 mm. In this embodiment, the carbon heat insulation 12 works as an absorber for absorbing the raw material gas.

The raw material gas is supplied from the raw material gas supply passage 14a of the heat insulation 14, and introduced in the reactive chamber 11 through the through hole 16a of the plate 16 and the tube 15. Then, the gas is led to the silicon carbide single crystal substrate 13 as the seed crystal. Further, the gas changes its flowing direction reversely at the substrate 13, and passes between the outer circumference of the tube 15 and the inner circumference of the cylinder 11a so that the gas is led to the outside of the reactive chamber 11. After that, the gas changes its flowing direction reversely again at the carbon heat insulation 12, and then the gas passes between the outer circumference of the cylinder 11a and the inner circumference of the carbon heat insulation (i.e., the absorber) 12 so that the gas is led to an emission system (not shown). At that time, the returned raw material gas is heated again with the heater (15, 16, 17, 20), and then the raw material gas is absorbed by the carbon heat insulation (i.e., absorber) 12.

Further, the crystal growth of the silicon carbide single crystal 21 grown from the silicon carbide single crystal substrate (i.e., the seed crystal) 13 can be monitored. Specifically, the silicon carbide single crystal 21 is irradiated with X ray from the outside of the vacuum chamber 10. The X ray passed through the vacuum chamber 10 is converted to a signal so that the crystal growth is monitored. The temperature of the heater, i.e., the temperature of the bottom of the plate 16 can be measured by a pyrometer through an observation window (i.e., a through hole) 22, which is disposed on the heat insulation 14. Further, the temperature of the top of the cover 11b of the reactive chamber 11 can be measured by the pyrometer through the pipe 18. In this equipment, the emission system includes a pump (not shown). An opening degree of a discharge valve (not shown) for discharging the gas to the pump is controlled so that vapor pressure in the chamber 11 is regulated at a constant pressure.

Next, a manufacturing method of the silicon carbide single crystal 21 is described as follows.

At first, the silicon carbide single crystal substrate 13 as the seed crystal is disposed inside the reactive chamber 11. The raw material gas including the silicon containing gas and the carbon containing gas is introduced into the vacuum chamber 10. The flow rate of the raw material gas is controlled by a mass flow controller. The raw material gas is heated up to a predetermined temperature with the heater (15, 16, 17, 20) of the raw material gas. The temperature of the heater (15, 16, 17, 20) is measured by the pyrometer through the observation window (i.e., the through hole) 22 in the heat insulation 14.

The raw material gas heated up to the high temperature is introduced into the reactive chamber 11. Then, the silicon carbide single crystal 21 is grown from the silicon carbide single crystal substrate 13 as the seed crystal, which is kept at a low temperature lower than that of the introduced gas. The temperature of the cover 11b of the reactive chamber 11 is measured by the pyrometer through the pipe 18 so that the temperature of the cover 11b is converted to the temperature of the silicon carbide single crystal substrate 13. During the crystal growth, a growth rate of the silicon carbide single crystal 21 is detected with the X ray. The result of the detection is reflected to the rotation or the elevation of the reactive chamber 11 (i.e., the silicon carbide single crystal substrate 13).

In detail, the reactive chamber 11 is formed independently from the tube 15, which discharges the raw material gas heated at the heater (15, 16, 17, 20) toward the reactive chamber 11. Further, the silicon carbide single crystal substrate 13 as the seed crystal is movably supported on the reactive chamber 11. The substrate 13 is movable toward and against a direction of the tube 15 of the heater. Here, the distance L1 between the growth surface of the silicon carbide single crystal 21 and the tube 15 of the heater is set to be equal to or smaller than 20 mm. Preferably, the distance L1 is set to be equal to or smaller than 5 mm.

On the other hand, the raw material gas, which does not contribute to the crystal growth, changes its flowing direction reversely at the silicon carbide single crystal substrate 13, and then flows downward along with the inner wall of the cylinder 11a of the reactive chamber 11. Specifically, to heat again the raw material gas, which does not contribute to the crystal growth on the silicon carbide single crystal substrate 13 as the seed crystal, the reversed raw material gas flow is prepared. The reversed raw material gas flow is opposite to the raw material gas flow, which flows toward the silicon carbide single crystal substrate 13 as the seed crystal. Then, the raw material gas is discharged to the outside of the reactive chamber 11 (i.e., the growth space) through the clearance (i.e., D1) between the inner circumference of the cylinder 11a of the reactive chamber and the outer circumference of the tube 15.

Accordingly, since the raw material gas flow is reversed at the silicon carbide single crystal substrate 13, in the raw material gas flow, the temperature of the raw material gas is reduced at the silicon carbide single crystal substrate 13 (and its periphery) as the seed crystal so that the gas becomes supersaturated and the crystal is deposited. Specifically, the gas becomes supersaturated so that the raw material gas is separated out on the substrate 13 as the single crystal 21. Further, the temperature of the raw material gas is increased at the upstream side and the downstream side from the substrate 13 so that the gas becomes unsaturated and the crystal is not deposited. Specifically, the gas becomes unsaturated so that the gas remains the gas state (i.e., the gas is not separated out). Thus, the temperature gradient is set in such a manner that the temperature of the inner wall (i.e., sidewall) of the reactive chamber 11 is reduced as it goes toward the silicon carbide single crystal substrate 13 as the seed crystal. Therefore, the raw material gas can provide to deposit the single crystal 21 on the silicon carbide single crystal substrate 13 as the seed crystal, the temperature of which is the lowest. Then, the gas flow is reversed at the substrate 13 so that the gas flows along with the inner wall (i.e., the side wall) of the reactive chamber 11. The reversed raw material gas becomes unsaturated on the inner wall (i.e., the sidewall) of the reactive chamber 11, the temperature of which is higher than that of the silicon carbide single crystal substrate 13. Therefore, the reversed raw material gas is discharged to the outside of the reactive chamber 11 without depositing the crystal on the inner wall (i.e., the sidewall). As a result, the growth yield of the silicon carbide single crystal 21 is improved compared with the method (shown in FIG. 20) that provides to uniform the temperature of the gas flow path. Further, the reactive chamber 11 (i.e., the growth space) is prevented from being plugged by the deposited crystal.

Further, the carbon heat insulation (i.e., the absorber) 12 is disposed on the outer circumference of the reactive chamber 11 at a predetermined distance (D2 in FIG. 2). The raw material gas, which does not contribute to the crystal growth, is absorbed at the outside of the reactive chamber 11. Specifically, the silicon carbide in the raw material gas discharged from the reactive chamber 11 (i.e., the growth space) separates out in the carbon heat insulation (i.e., the absorber) 12. In detail, as shown in FIG. 3, in the carbon heat insulation (i.e., the absorber) 12 disposed outside of the reactive chamber 11, the temperature gradient is set in such a manner that the temperature of the carbon heat insulation 12 is reduced as it goes toward the outside by using the heater (15, 16, 17, 20) and the coil 19. The silicon carbide absorbed in the carbon heat insulation (i.e., the absorber) 12 is accumulated in a low temperature portion sequentially. Thus, the silicon carbide can be retrieved.

On the other hand, as shown in FIGS. 2A and 3A, the gas discharged from the reactive chamber 11 except for the silicon carbide, which remains in the raw material gas, passes through a clearance between the inner circumference of the carbon heat insulation (i.e., the absorber) 12 and the outer circumference of the reactive chamber 11. Then, the gas is discharged to the pump (not shown), i.e., the emission system. Therefore, the gas flow path is prevented from being plugged.

Accordingly, in the raw material gas flow, the raw material gas is heated at the upstream side of the silicon carbide single crystal substrate 13 as the seed crystal. After that, the heated gas provides to deposit the single crystal 21 on the silicon carbide single crystal substrate 13 as the seed crystal. The raw material gas, which does not contribute to the crystal growth, is heated again, and then the gas is absorbed in the carbon heat insulation 12 as the absorber. Thus, the growth yield of the silicon carbide single crystal 21 is improved. Further, the gas flow path including the reactive chamber 11 (i.e., the growth space) is not blockaded (i.e., plugged), so that the stationary crystal growth is provided.

Further, the reactive chamber 11 is separated from the tube 15, which discharges the raw material gas heated with the heater (15, 16, 17, 20) toward the reactive chamber 11. Therefore, the heat conduction is intercepted, so that the temperature difference between the tube 15 of the heater and the reactive chamber 11 can be set larger. When the temperature difference is set large, degree of super saturation of the gas at the silicon carbide single crystal substrate 13 as the seed crystal becomes larger. Thus, the growth yield of the crystal growth becomes higher. Further, the growth environment such as the temperature of the growth surface may be changed as the crystal grows longer. To suppress the change of the environment, the silicon carbide single crystal substrate 13 as the seed crystal is timely rotated and/or elevated up and down. In view of this aspect, it is significant to separate between the reactive chamber 11 and the heater (15, 16, 17, 20).

Further, the coolant gas is introduced through the pile 18 so that the temperature of the silicon carbide single crystal substrate (i.e., the seed crystal) 13 is lowered. Thus, only the temperature of the silicon carbide single crystal substrate 13 as the seed crystal is locally lowered so that the growth yield of the single crystal 21 is improved. Further, the poly crystal deposited around the single crystal 21 can be separated from the single crystal 21, so that the high quality single crystal 21 is deposited (i.e., grown) sufficiently.

Although the carbon heat insulation 12 is used as the absorber, a porous carbon or a carbon felt can be used as the absorber. That is, the absorber is provided by at least one of the porous carbon, the carbon felt and the carbon heat insulation.

Next, an experimental test of the crystal growth of the silicon carbide single crystal is described as follows.

SiH$_4$ (i.e., silane gas) with a flow rate of 0.01–10 liters per minute and C$_3$H$_8$ (i.e., propane gas) with a flow rate of 0.01–10 liters per minute as the raw material gas are introduced. Further, H$_2$ (i.e., hydrogen gas) with a flow rate of 0–100 liters per minute, Ar (i.e., argon gas) with a flow rate of 0–100 liters per minute, and/or He (i.e., helium gas) with a flow rate of 0–100 liters per minute as the carrier gas of the raw material are introduced appropriately. Further, to control electric properties of the single crystal, N$_2$ (i.e., nitrogen gas) with a flow rate of 0–10 liters per minute and/or (CH$_3$)$_3$Al (i.e., tri-methyl aluminum gas) with a flow rate of 0–10 liters per minute are introduced, if necessary. Ar (i.e., argon gas) with a flow rate of 0–100 liters per minute as the coolant gas is introduced into the reactive chamber 11. Pressure in crystal growth equipment (i.e., the vacuum chamber 10) is controlled at a predetermined constant pressure in a range between 1 kPa and 100 kPa. The raw material gas is heated up in a range between 2300° C. and 2700° C. by the heater such as the high frequency induction coil 20 and the like. The silicon carbide single crystal substrate 13 is kept at a predetermined temperature in a range between 2100° C. and 2600° C. by the high frequency induction coil 19. As a result, the silicon carbide single crystal 21 is grown from the silicon carbide single crystal substrate 13 with a growth rate of 0.1–10 mm per hour. The poly crystal is not deposited except for on a top of the reactive chamber 11 having cylindrical shape. Thus, the high quality single crystal is effectively grown. Further, the silicon carbide absorbed by the carbon heat insulation 12 does not plug passages of the gas, so that the continuous crystal growth is performed.

Next, one example of experimental tests of the crystal growth of the silicon carbide single crystal is described in specific figures.

TEST EXAMPLE

By using the above manufacturing equipment, SiH$_4$ with a flow rate of 1 liter per minute, C$_3$H$_8$ with a flow rate of 0.333 liters per minute, H$_2$ with a flow rate of 10 liters per minute, and He with a flow rate of 5 liters per minute are introduced. The atmospheric pressure is 53 kPa, the temperature of the crystal substrate is 2300° C. and the temperature of the heater of the raw material gas is 2400° C. Thus, the SiC single crystal is grown with the growth rate of 1 mm per hour.

Third Embodiment

Next, a third embodiment of the present invention is described. Specifically, difference between the second and third embodiments is described mainly.

Figure 4:
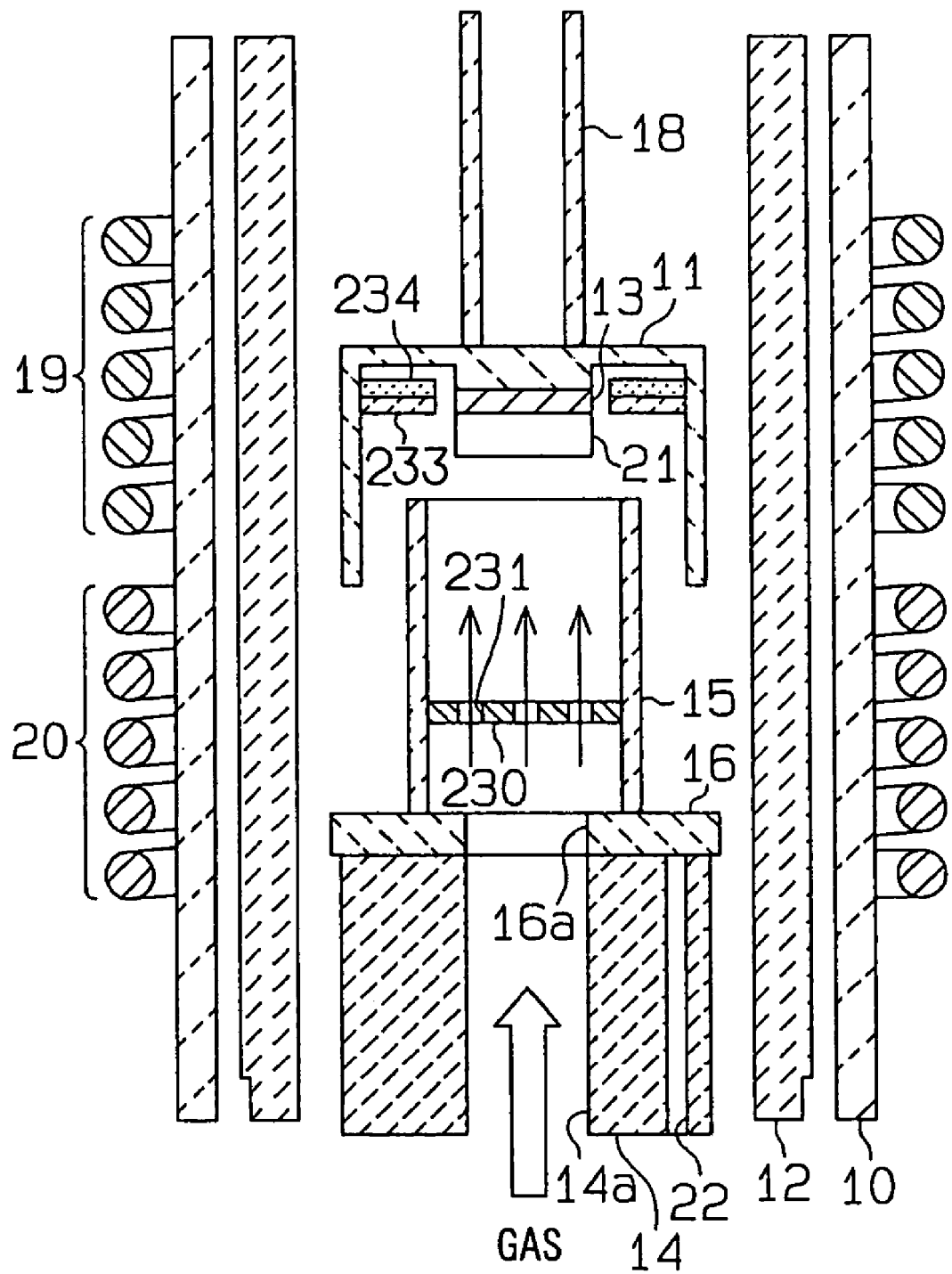
FIG. 4 is a schematic cross sectional view showing equipment for manufacturing a silicon carbide single crystal, according to a third embodiment of the present invention.

FIG. 4 is a schematic cross sectional view showing manufacturing equipment of silicon carbide single crystal, according to the third embodiment.

In this embodiment, a plate 230 is used as a component of the heater (15, 16, 20) of the raw material gas. The plate 230 is disposed in a passage of the raw material gas in the tube 15, and has multiple through holes 231. The plate 230 is made of tantalum. The raw material gas passes through the through holes 231 of the plate 230 so that the gas is stirred. Thus, the stirred raw material gas is introduced into the reactive chamber 11 (i.e., the growth space) through the multiple through holes 231 of the plate 230. At that time, flow velocity of the raw material gas is different at each place. The raw material gas is heated at the upstream side from the silicon carbide single crystal substrate 13 as the seed crystal, and then the gas is introduced to the silicon carbide single crystal substrate 13 as the seed crystal. At that time, the raw material gas is stirred so that stirring the raw material gas in the reactive chamber 11 (i.e., the growth space) is promoted. Thus, the growth yield of the single crystal is improved. Further, the plate 230 contributes to raise the temperature of the raw material gas efficiently.

Further, in the reactive chamber 11, a graphite member 233 is disposed around the silicon carbide single crystal substrate 13. A heat insulation 234 is bonded on a top of the graphite member 233, so that the heat insulation 234 is disposed around the silicon carbide single crystal substrate 13. The temperature of the graphite member 233 is higher than that of the silicon carbide single crystal substrate (i.e., the seed crystal) 13. Thus, since the heat insulation 234 is disposed around the silicon carbide single crystal substrate 13 as the seed crystal, the temperature of the silicon carbide single crystal substrate 13 as the seed crystal in the reactive chamber 11 is locally lowered, compared with the periphery of the substrate 13.

The detail of this method is described as follows with reference to FIGS. 5A and 5B.

Figure 5A:
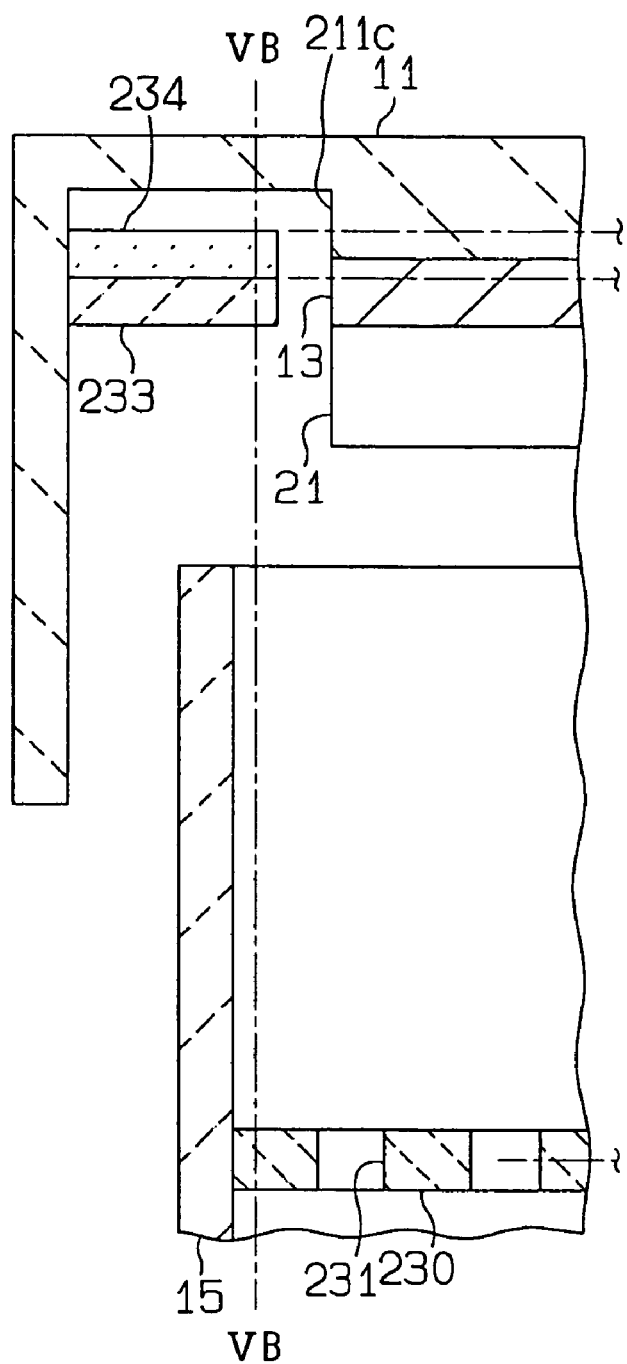
FIG. 5A is an enlarged cross sectional view showing a part of the equipment.
Figure 5B:
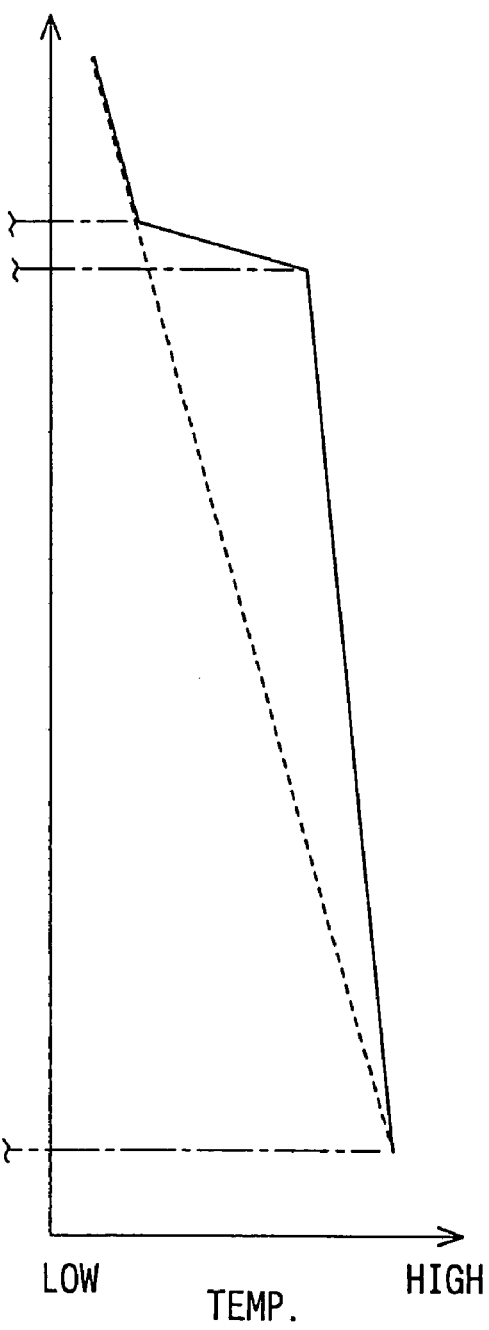
FIG. 5B is a graph showing a temperature profile disposed on line VB—VB in FIG. 5A, according to the third embodiment.

In FIG. 5A, a protrusion 211c is formed on a ceiling surface of the reactive chamber 11. The silicon carbide single crystal substrate (i.e., the seed crystal) 13 is mounted on the protrusion 211c. The graphite member 233 and the heat insulation 234 extend in a horizontal direction and disposed around the silicon carbide single crystal substrate (i.e., the seed crystal) 13 at almost the same height as the silicon carbide single crystal (i.e., the seed crystal) 13. Thus, temperature gap between the upper and lower surfaces of the heat insulation 234 is provided in the temperature profile of the raw material gas in the vertical direction, as shown in FIG. 5B. If the equipment has neither graphite member 233 nor heat insulation 234, the temperature distribution becomes a broken line in FIG. 5B. When the equipment has both, the temperature distribution becomes a solid line in FIG. 5B, so that the temperature difference is produced. Thus, only the temperature of the silicon carbide single crystal substrate 13 as the seed crystal is locally lowered. Thus, the growth yield of the single crystal 21 is improved. Further, the poly crystal deposited around the single crystal 21 is separated from the single crystal 21, so that the high quality single crystal 21 is grown effectively.

The experimental test for the crystal growth is performed by using the above manufacturing equipment. The growth rate in the experimental test is improved by 20–40% compared with the [Test Example] of the second embodiment.

Fourth Embodiment

Next, a fourth embodiment of the present invention is described. Specifically, difference between the second and fourth embodiments is described mainly.

Figure 6:
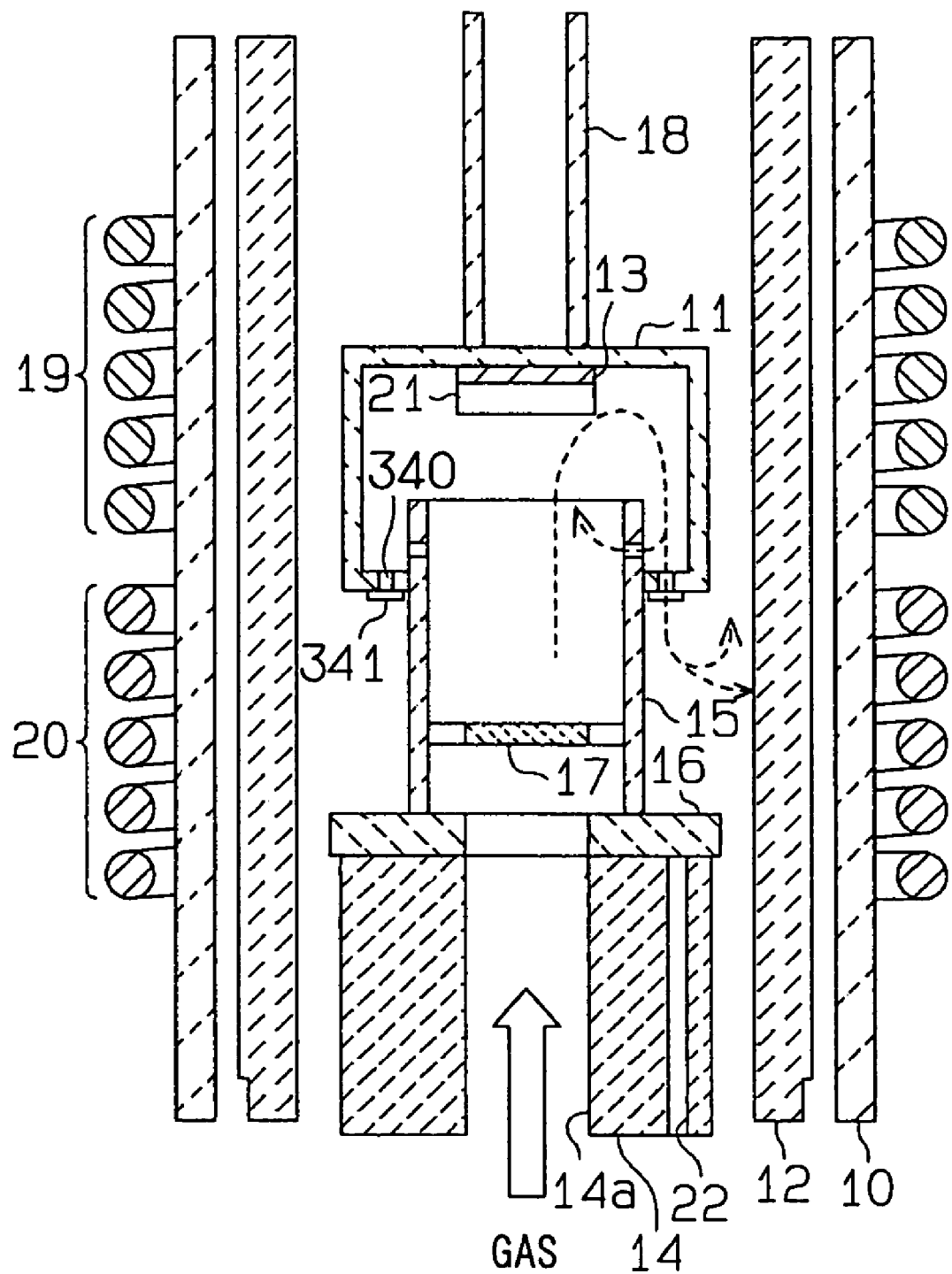
FIG. 6 is a schematic cross sectional view showing equipment for manufacturing a silicon carbide single crystal, according to a fourth embodiment of the present invention.

FIG. 6 is a schematic cross sectional view showing manufacturing equipment of silicon carbide single crystal, according to the fourth embodiment.

A clearance between the outer circumference of the tube 15 and a lower opening of the reactive chamber 11 is closed. Further, an outlet (i.e., a through hole) 340 of the raw material gas is formed on a lower end of the reactive chamber 11. A hydrogen separation film 341 is disposed on the outlet (i.e., the through hole) 340. The hydrogen separation film 341 passes only the hydrogen gas. When the raw material gas introduced into the reactive chamber 11 (i.e., the growth space) is discharged, the raw material gas is filtered with the hydrogen separation film 341 for passing only the hydrogen gas so that the hydrogen gas is selectively discharged. Thus, the emission gas from the reactive chamber 11 is only the hydrogen gas. In the broad sense, the gas emitted from the reactive chamber 11 does not include Si and C.

By using the above construction, a part of the raw material gas is circulated in the reactive chamber 11. In detail, the raw material gas from the tube 15 flows toward the silicon carbide single crystal substrate (i.e., the seed crystal) 13. Further, the part of the raw material gas changes its flowing direction reversely at the silicon carbide single crystal substrate (i.e., the seed crystal) 13, and then the part is supplied together with the new raw material gas to the silicon carbide single crystal substrate 13. Accordingly, the introduced raw material gas is effectively used for the crystallization. Thus, the raw material gas, which is not used for the crystallization, is reused. Therefore, the introduced raw material gas contributes to the crystal growth effectively. Specifically, in the method shown in FIGS. 20 and 21, a ratio of the raw material, which contributes to the single crystal growth, becomes small so that the raw material efficiency becomes small. The above method and equipment resolve the problem of the low efficiency, so that the raw material efficiency is improved.

A carbon nanotube film is used as the hydrogen separation film 341, so that almost all of the raw material gas contributes to the single crystal growth.

Fifth Embodiment

Next, a fifth embodiment of the present invention is described. Specifically, difference between the second and fifth embodiments is described mainly.

Figure 7:
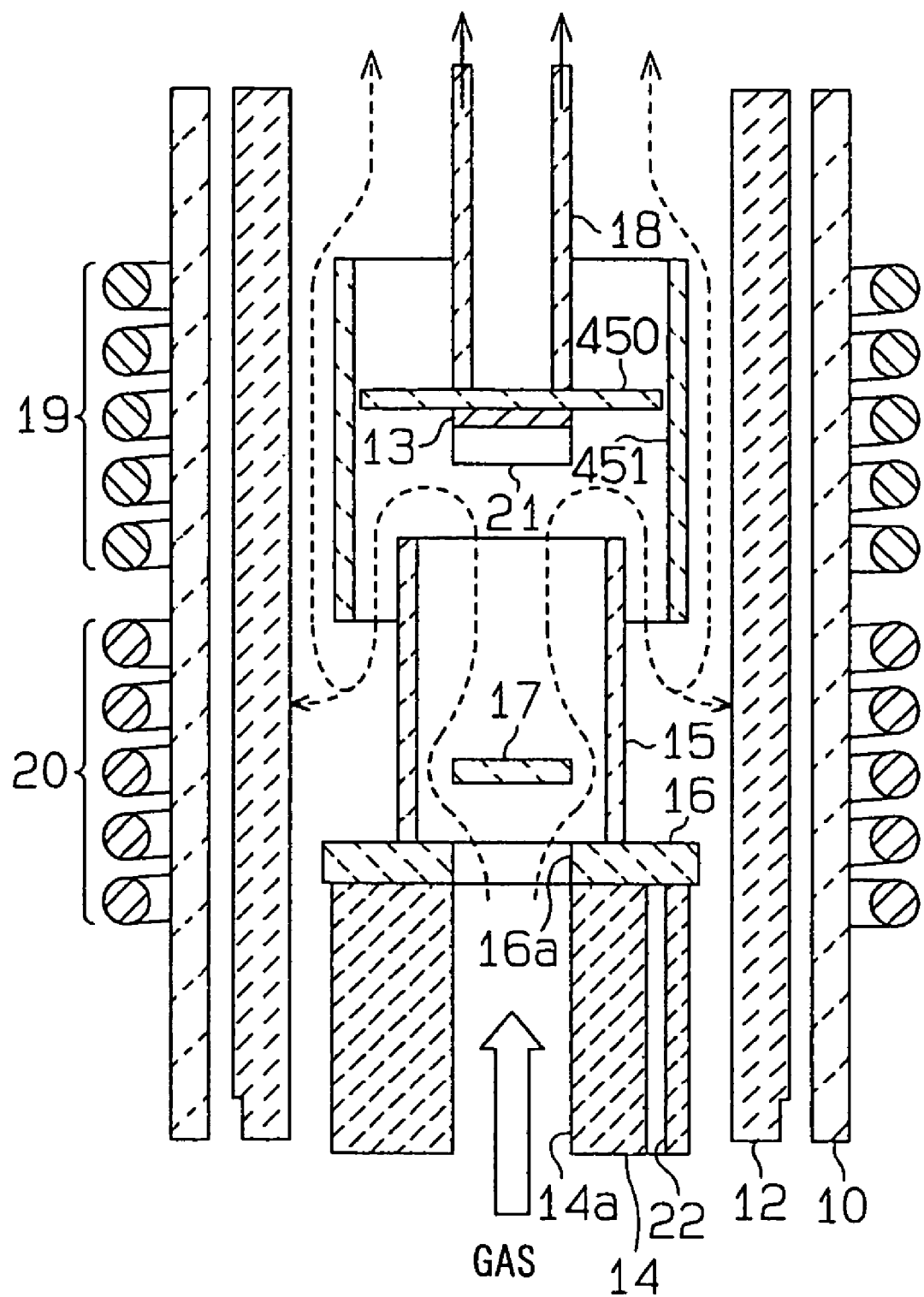
FIG. 7 is a schematic cross sectional view showing equipment for manufacturing a silicon carbide single crystal, according to a fifth embodiment of the present invention.

FIG. 7 is a schematic cross sectional view showing manufacturing equipment of silicon carbide single crystal, according to the fifth embodiment.

In this embodiment, the reactive chamber 11 is composed of a base 450 and a cylinder (i.e., tube) 451. The cylinder 451 provides the growth space. The base 450 is separated from the cylinder 451, so that they are independent each other. The base 450 supports the silicon carbide single crystal substrate 13 as the seed crystal. Further, the base 450 is movable in the cylinder 451. Thus, the cylinder 451 and the silicon carbide single crystal substrate 13 with the silicon carbide single crystal 21 are independently movable, respectively.

Therefore, the crystal growth can be performed in such a manner that a relative relationship of positioning among the growth surface of the silicon carbide single crystal 21, the tube 15 for providing the growth space and the heater for heating the raw material gas (specifically, the tube 15) is kept during the crystal growth. As a result, the change of the growth environment is minimized in a case where the grown crystal becomes longer.

Sixth Embodiment

A sixth embodiment of the present invention is described with reference to the drawings.

Figure 8A:
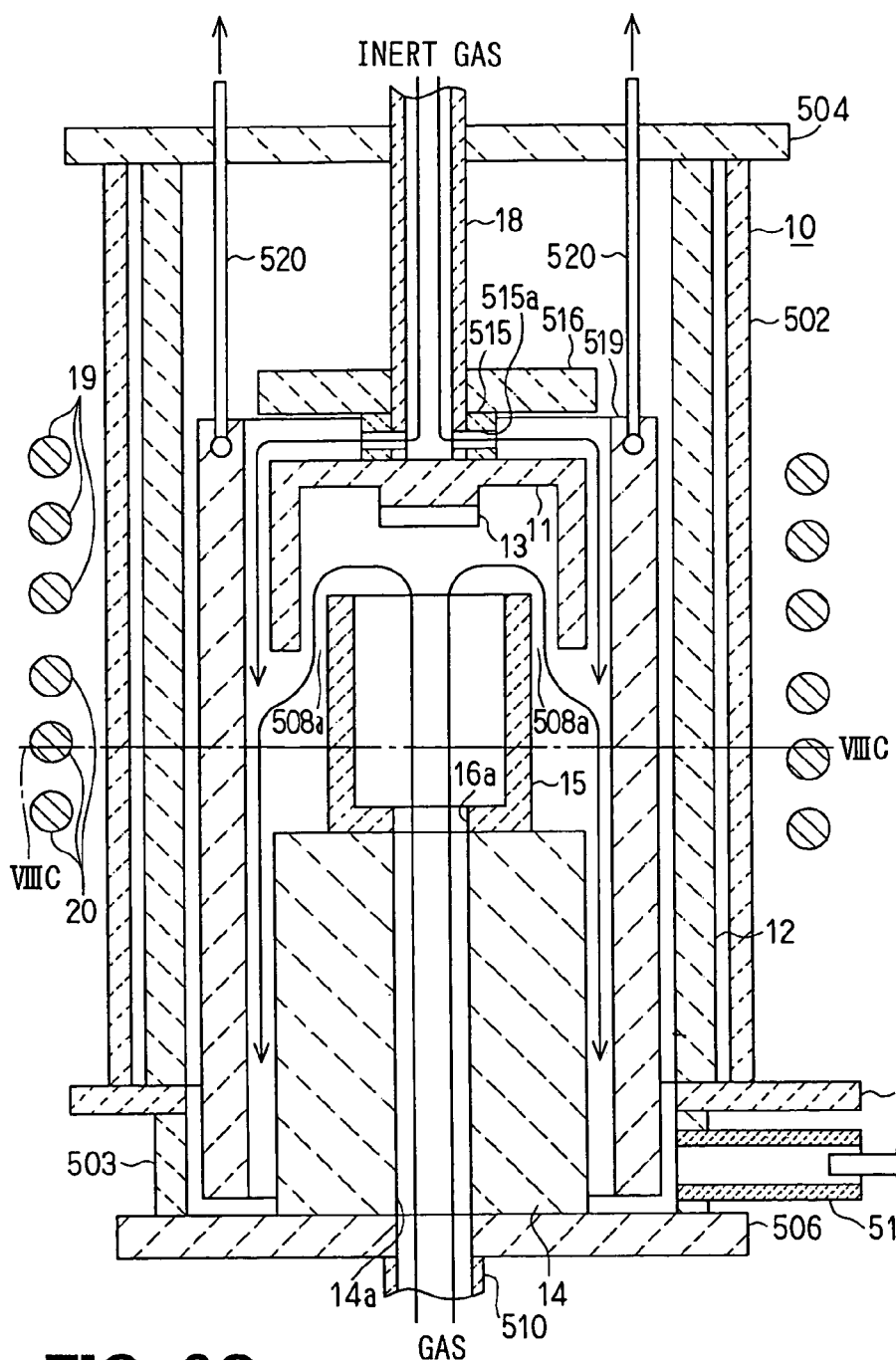
FIG. 8A is a schematic cross sectional view showing equipment for manufacturing a silicon carbide single crystal.

FIG. 8A is a schematic cross sectional view showing manufacturing equipment of a silicon carbide single crystal, according to the sixth embodiment.

In FIG. 8A, the equipment includes the vacuum chamber 10 composed of multiple cylinders 502, 503 and multiple covers (i.e., flanges) 504, 505, 506. The cylinders 502, 503 are disposed in a standing manner and disposed in a vertical direction. An upper opening of the cylinder 502 is covered with the upper cover (i.e., upper flange) 504. A lower opening of the cylinder 502 connects to the cylinder 503 through the lower cover (i.e., lower flange) 505. The inside of the cylinder 502 connects to the inside of the cylinder 503. A lower opening of the cylinder 503 is covered with the lower cover (i.e., lower flange) 506.

The heat insulation 12 having a cylindrical shape is disposed along with an inner wall of the cylinder 502 in the vacuum chamber 10. Inside of the heat insulation 12, the reactive chamber 11 having a cylindrical shape with a cover is disposed. Specifically, the reactive chamber 11 as a whole has a cylindrical shape, a top of the reactive chamber 11 is covered, and a bottom of the reactive chamber 11 is opened. A silicon carbide single crystal substrate 13 as a seed crystal is disposed downwardly on a ceiling of the reactive chamber 11. With regard to the heat insulation 12 and the reactive chamber 11, a sidewall of the reactive chamber 11 is apart from the heat insulation 12 at a predetermined distance.

A raw material gas introduction pipe 510 is connected to a center portion of the lower cover (i.e., the lower flange) 506. The raw material gas is introduced into the vacuum chamber 10 through the raw material gas introduction pipe 510. The raw material gas is, for example, a mixture of monosilane gas (which includes Si), propane gas (which includes C) and carrier gas, all of which are mixed at predetermined proportions. On the other hand, an emission pipe 513 is connected to the sidewall of the cylinder 503.

In the vacuum chamber 10, the heat insulation 14 is disposed downside of the reactive chamber 11. The heat insulation 14 includes a raw material gas supply passage 14a. The raw material gas is introduced into the raw material gas supply passage 14a through the raw material gas introduction pipe 510. The raw material gas flows toward the reactive chamber 11 disposed upside through the passage 14a.

Inside of the vacuum chamber 10, the tube 15 having a cylindrical shape is disposed in a standing manner and disposed on the upper end of the heat insulation (i.e., a raw material gas supply portion) 14. A through hole 16a (i.e., a raw material gas supply passage) for passing the gas is formed on a center portion of a bottom of the tube 15. The raw material gas from the raw material gas supply passage 14a of the heat insulation 14 is introduced into the tube 15 through the through hole 16a.

The tube 15 is disposed on a lower opening of the reactive chamber 11. Specifically, the reactive chamber 11 and the tube 15 have a certain arrangement, in which the tube 15 is covered with the reactive chamber 11 having the cylindrical shape with the cover from the lower opening side of the reactive chamber 11. In this case, the outer circumference of the tube 15 is apart from the inner circumference of the reactive chamber 11 at a predetermined distance. Further, the upper end of the tube 15 is apart from the ceiling of the reactive chamber 11.

On the other hand, the pipe 18 is fixed to a center portion of the upper cover (i.e., the upper flange) 504 in such a manner that the pipe 18 penetrates through the upper cover 504. The pipe 18 extends in a vertical direction in the vacuum chamber 10. The top of the reactive chamber 11 is fixed and connected to a lower end of the pipe 18 in such a manner that the pipe 18 adheres to the reactive chamber 11. Thus, the reactive chamber 11 is connected to and supported to the pipe 18. A heat insulation 516 is disposed on the top of the reactive chamber 11 through a connection member 515. The heat insulation 516 is formed to cover the top of the reactive chamber 11. Thus, the reactive chamber 11 is disposed in the vacuum chamber 10 to be surrounded by the heat insulations 12, 14, 516.

Further, an inert gas is introduced through the pipe 18 for supporting the reactive chamber 11. A gas flow passage 515a is formed in the connection member 515. The inert gas is introduced into the vacuum chamber 10 through the gas flow passage 515a and through the pipe 18.

In FIG. 8A, the high frequency induction coil (i.e., RF coil) 19 is wounded on the outer circumference of the vacuum chamber 10. The RF coil 19 is disposed at a predetermined height, which corresponds to a height of the silicon carbide single crystal substrate (i.e., the seed crystal) 9. The RF coil 19 is energized so that the silicon carbide single crystal substrate (i.e., the seed crystal) 9 is heated during the crystal growth.

The high frequency induction coil (i.e., RF coil) 20 is wounded on the outer circumference of the vacuum chamber 10. The RF coil 20 is disposed under the high frequency induction coil 19. The RF coil 20 is energized so that the raw material gas passing through the tube 15 is heated. Here, the center of the lower coil 20 in the vertical direction is the same height as the tube 15. Thus, the raw material gas is heated up to the maximum temperature at this height. Thus, a heater (i.e., high frequency induction type heater equipment) is composed of the high frequency induction coils (i.e., the RF coil 9, 20, and the tube 15. The heater heats the raw material gas to be introduced to the silicon carbide single crystal substrate 13 as the seed crystal up to a temperature higher than that of the silicon carbide single crystal substrate 13 as the seed crystal.

Figure 8B:
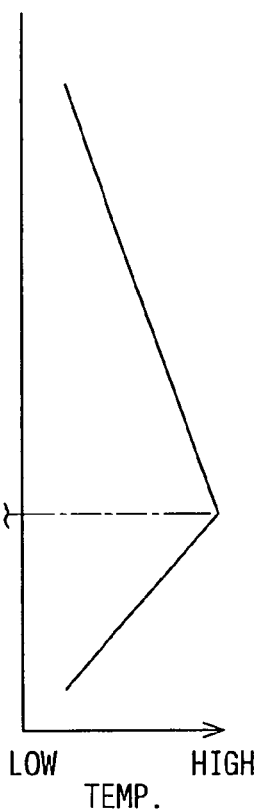
FIG. 8B is a graph showing a relationship between a position and temperature in the equipment.
Figure 8C:
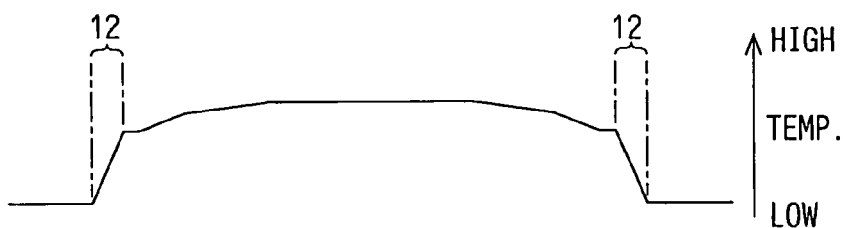
FIG. 8C is a graph showing a temperature profile disposed on line VIIIC—VIIIC in FIG. 8A, according to a sixth embodiment of the present invention.

Further, the reactive chamber 11 has the certain construction, which provides to return the part of the raw material gas to the upstream side from the substrate 13 after the single crystal is grown on the silicon carbide single crystal substrate 13 as the seed crystal by using the raw material gas heated with the heater (15, 1.9, 20). Here, the part of the raw material gas (i.e., the non-reacted raw material gas) does not contribute to the crystal growth. In detail, as shown in a temperature distribution in a vertical direction in FIG. 8B, the reactive chamber 11 has a temperature gradient in such a manner that the temperature in the reactive chamber 11 is reduced toward the silicon carbide single crystal substrate 13 as the seed crystal. FIG. 8C is a graph showing a temperature profile disposed on line VIIIC—VIIIC in FIG. 8A. After the raw material gas reaches the silicon carbide single crystal substrate 13 as the seed crystal in the reactive chamber 11, the raw material gas is discharged along with the inner wall of the reactive chamber 11. Specifically, the raw material gas is introduced in the center of the reactive chamber 11 from the opening of the reactive chamber 11 having the cylindrical shape with the cover, and then the gas reaches the silicon carbide single crystal substrate 13 as the seed crystal. After that, the gas returns to the upstream side along with the inner wall of the reactive chamber 11. Then, the gas flows from the opening (i.e., an outlet 508a of the non-reacted raw material gas) of the reactive chamber 11 to the downstream side. Further referring to the raw material gas flow, the raw material gas is supplied from the raw material gas supply passage 14a of the heat insulation 14, and introduced in the reactive chamber 11 through the through hole 16a of the tube 15 and the inside of the tube 15. Then, the gas is led to the silicon carbide single crystal substrate 13 as the seed crystal. Further, the gas changes its flowing direction reversely, and passes between the outer circumference of the tube 15 and the inner circumference of the reactive chamber 11 so that the gas is led to the outside of the reactive chamber 11 from the outlet 508a for the non-reacted raw material gas as an opening of the reactive chamber 11 disposed on the outer circumference of the tube 15. After that, the gas flows from the outlet 508a of the reactive chamber 11 for the non-reacted raw material gas toward the emission pipe 513 connected to the sidewall of the cylinder 503.

An absorber 519 having a cylindrical shape is disposed between the outer circumference of the reactive chamber 11 and the inner wall of the heat insulation 12 in the vacuum chamber 10. Specifically, the absorber 519 is disposed between the outlet 508a of the reactive chamber 11 for the non-reacted raw material gas and the heat insulation 12. The absorber 519 is made of one of carbon heat insulation, porous carbon, a carbon plate (specifically, a thin plate), a silicon carbide plate (specifically, a thin plate), a tantalum plate (specifically, a thin plate), and a tantalum carbide plate (specifically, a thin plate). The absorber 519 absorbs the non-reacted raw material gas discharged from the reactive chamber 11 by converting from a gas state to a solid state. As shown in FIG. 8A, the upper end of the absorber 519 having a cylindrical shape is disposed at a height of the bottom of the heat insulation 516. The lower end of the absorber 519 is disposed inside of the cylinder 503 (i.e., downside of the lower end of the heat insulation 12). The absorber 519 is suspended on a support rod 520. Therefore, when the support rod 520 is raised up, the absorber 519 is moved upwardly.

The raw material gas discharged from the outlet 508a of the reactive chamber 11 for the non-reacted raw material gas flows between the outer circumference of the tube 15 and the inner circumference of the absorber 519. Then, the gas flows between the outer circumference of the heat insulation 14 and the inner circumference of the absorber 519 toward the emission pipe 513. On the other hand, the inert gas introduced from the pipe 18 is led between the top of the reactive chamber 11 and the bottom of the heat insulation 516 through the gas flow passage 515a of the connection member 515. Then, the inert gas flowing between the top of the reactive chamber 11 and the bottom of the heat insulation 516 flows downwardly between the outer circumference of the reactive chamber 11 and the inner circumference of the absorber 519. After that, the inert gas is led between the outer circumference of the tube 15 and the inner circumference of the absorber 519. Then, the inert gas flows toward the emission pipe 513 together with the raw material gas (i.e., the non-reacted raw material gas).

Next, a manufacturing method of the silicon carbide single crystal is described as follows.

Figure 9:
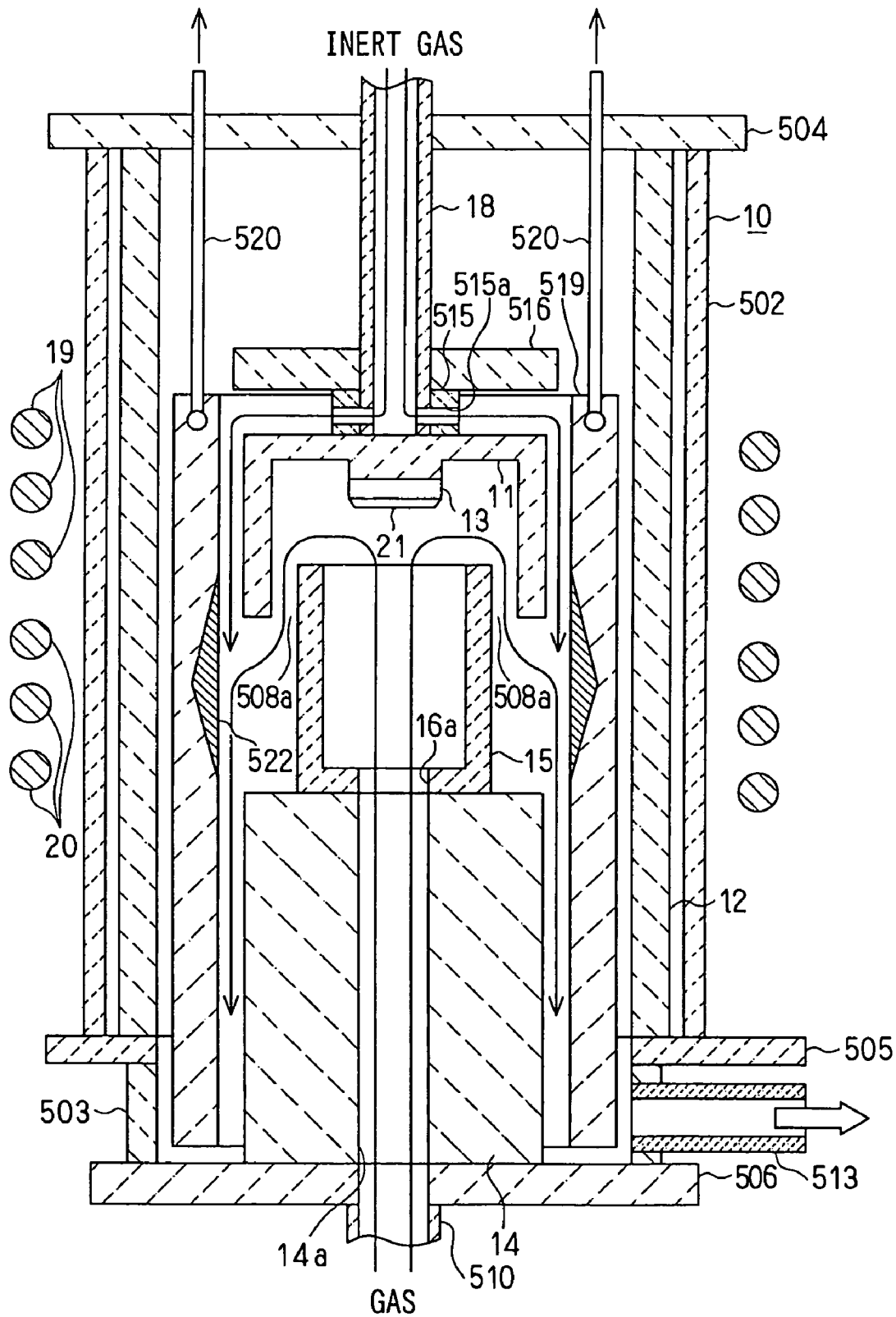
FIG. 9 is a schematic cross sectional view showing the equipment for manufacturing the silicon carbide single crystal during a crystal growth, according to the sixth embodiment.

The silicon carbide single crystal substrate 13 as the seed crystal is disposed inside the reactive chamber 11. The raw material gas including the silicon containing gas and the carbon containing gas is introduced into the reactive chamber 11. Thus, a silicon carbide single crystal 21 is grown from the silicon carbide single crystal substrate 13 as the seed crystal, as shown in FIG. 9.

In detail, the silicon carbide single crystal substrate 13 as the seed crystal is disposed inside the reactive chamber 11. The raw material gas including the silicon containing gas and the carbon containing gas is introduced into the vacuum chamber 10. The raw material gas is heated up to the maximum temperature at the outside of the reactive chamber 11 in the vacuum chamber 10. After that, the gas is led to the silicon carbide single crystal substrate 13 as the seed crystal in the reactive chamber 11. Thus, the silicon carbide single crystal 21 is grown from the silicon carbide single crystal substrate 13 as the seed crystal, temperature of which is lower than the maximum temperature.

During the crystal growth, the absorber 519 is displaced upwardly with a moving velocity in a range between 1 mm/hr and 100 mm/hr. Specifically, the absorber 519 is raised up with the moving velocity of 10 mm/hr during the crystal growth. Thus, the absorber 519 is raised up from a state shown in FIG. 9 to a state shown in FIG. 10. Therefore, the raw material gas (i.e., the non-reacted raw material gas), which does not contribute to the crystal growth, is discharged from the inside of the reactive chamber 11 through the outlet 508a of the non-reacted raw material gas. At that time, the non-reacted raw material gas is converted to the solid state so that the gas is absorbed into the absorber 519. Then, the silicon carbide poly crystal is separated out. Specifically, inside of the vacuum chamber 10, the non-reacted raw material gas discharged from the reactive chamber 11 is converted from the gas state to the solid state so that the raw material gas component is removed before the gas is absorbed into the heat insulation 12, 11. Thus, the amount of the silicon carbide poly crystal, which is absorbed into the heat insulation 12, is much reduced. Therefore, the deterioration of the heat insulation performance of the heat insulation 12 is prevented. Specifically, the absorber 519 is displaced during the crystal growth so that a portion of the absorber 519, which absorbs the non-reacted raw material gas, is changed.

When the heat insulation performance of the heat insulation 12 is constant, the temperature and the temperature distribution of the tube (i.e., a raw material gas heater vessel) 12 and the reactive chamber 11 become constant. Therefore, the deterioration of the crystal growth condition with time substantially disappears. Further, since the absorber 519 is displaced upwardly with a constant speed, the place, where the silicon carbide poly crystal 522 is deposited on, is also displaced. Thus, the silicon carbide poly crystal 522 is deposited on the whole area of the absorber 519, so that the absorbing amount in the absorber 519 becomes larger. Therefore, the crystal growth condition can be kept constant during a sufficiently long time. Thus, a silicon carbide single crystal ingot (21) has a long growth length and high quality.

Further, since the inert gas flows between the absorber 519 and the reactive chamber 11 and between the absorber 519 and the lower heat insulation 14 from the upper side, an emission path of the non-reacted raw material gas is prevented from being plugged.

Figure 10:
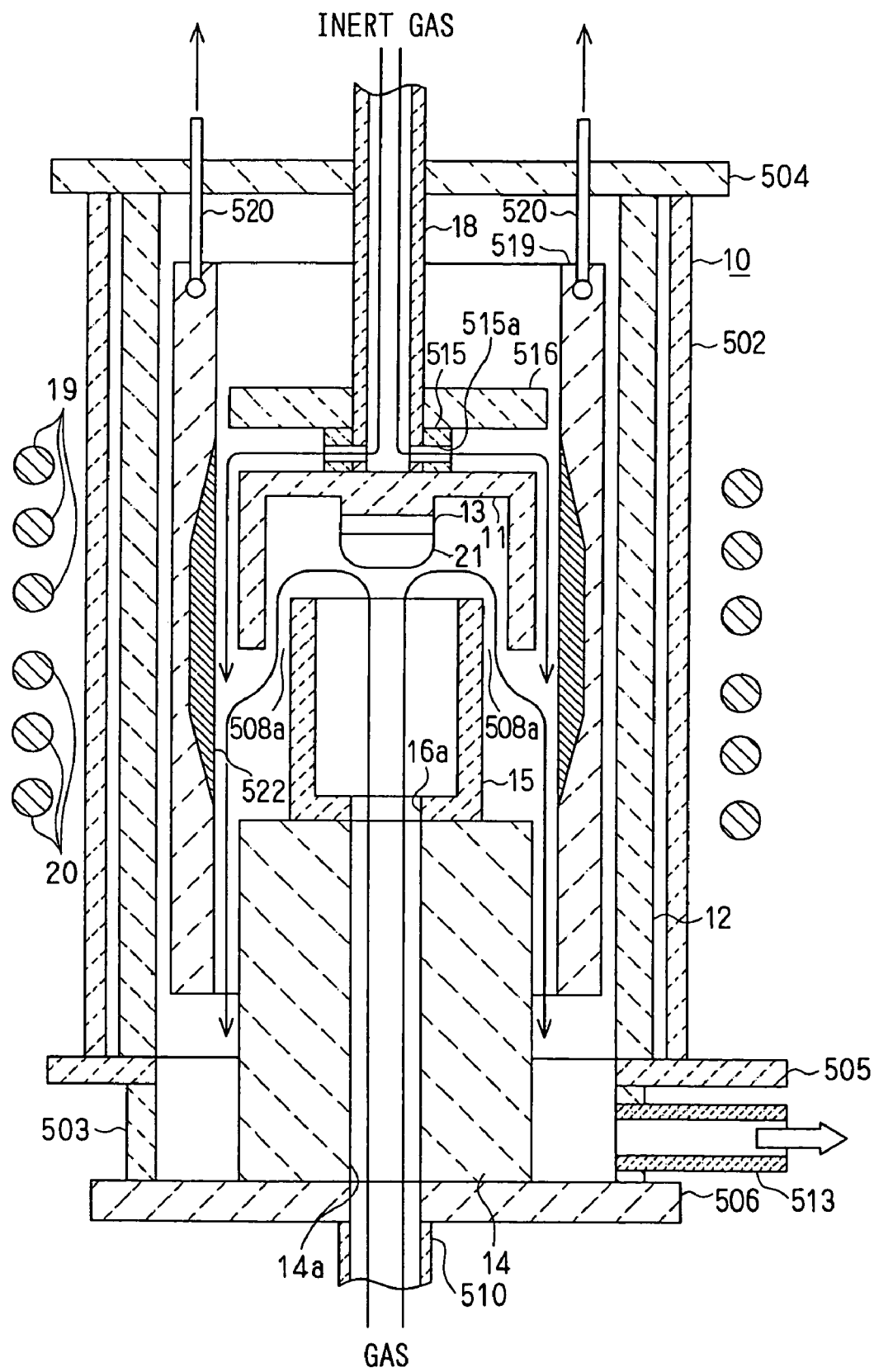
FIG. 10 is a schematic cross sectional view showing the equipment for manufacturing the silicon carbide single crystal during the crystal growth, according to the sixth embodiment.

Furthermore, as shown in FIG. 8A, the raw material gas flow is reversed in the reactive chamber 11, and the portion of the tube (i.e., the raw material gas heater vessel) 15 having the maximum temperature is disposed on a lower half of the tube 15. On the other hand, the outlet 508a of the reactive chamber for the non-reacted raw material gas is disposed on an upper half of the tube 15. Therefore, the gas is discharged from a high temperature side of the reactive chamber 11, so that the outlet 508a of the reactive chamber 11 for the non-reacted raw material gas is prevented from being plugged. Further, the absorber 519 is displaced upwardly, so that the moving direction of the absorber 519 is the direction, to which the portion of the absorber 519 absorbed the non-reacted raw material gas leaves from the portion of the maximum temperature in the vacuum chamber 10 so that the temperature of the portion of the absorber 519 is lowered. Thus, the silicon carbide poly crystal 522 absorbed in the absorber 519 does not pass through the portion of the maximum temperature, as shown in FIGS. 9 and 10, so that the silicon carbide poly crystal 522 absorbed in the absorber 519 is prevented from subliming again. Therefore, the temperature fluctuation of the tube 15 is suppressed minimally.

Next, the above method is explained in comparison with the case shown in FIGS. 11A–11C.

Figure 20:
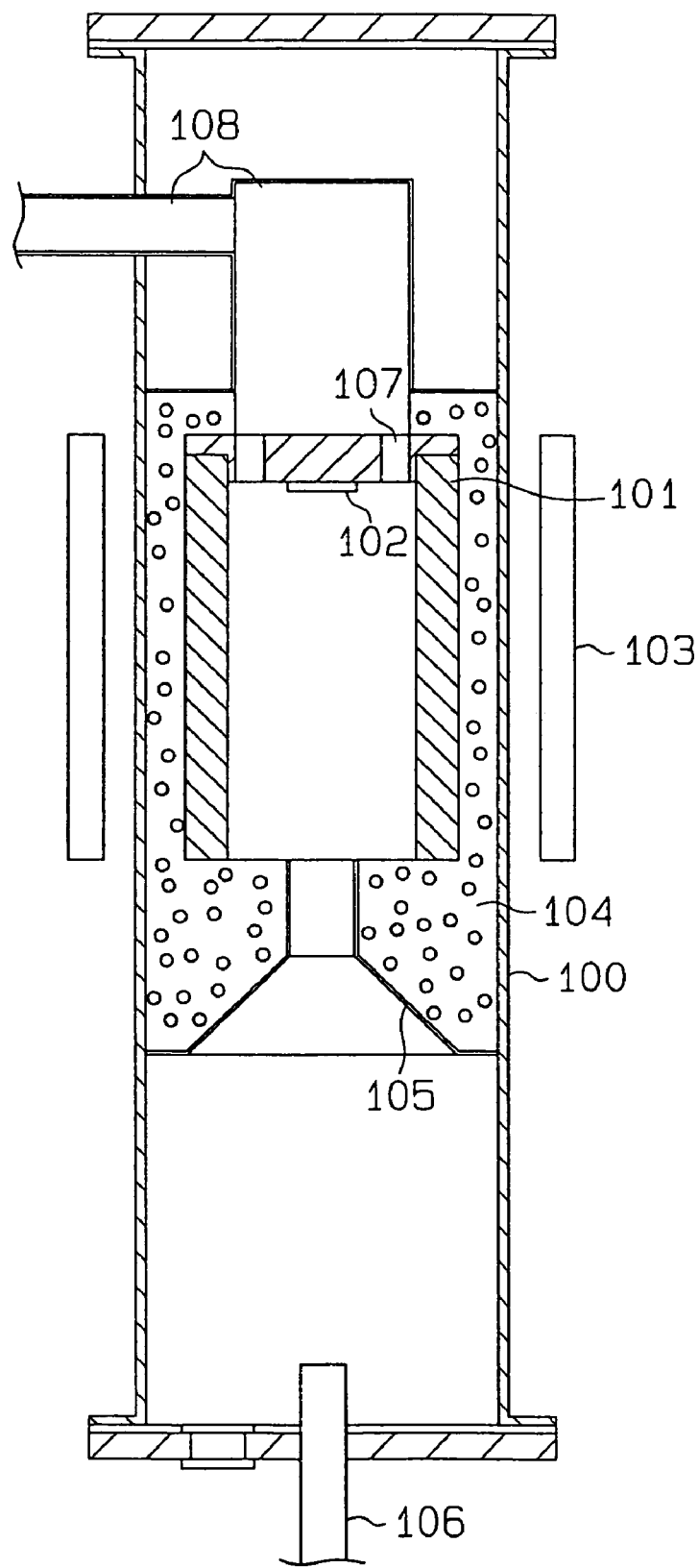
FIG. 20 is a schematic cross sectional view showing equipment for manufacturing a silicon carbide single crystal, according to a related art.
Figure 21:
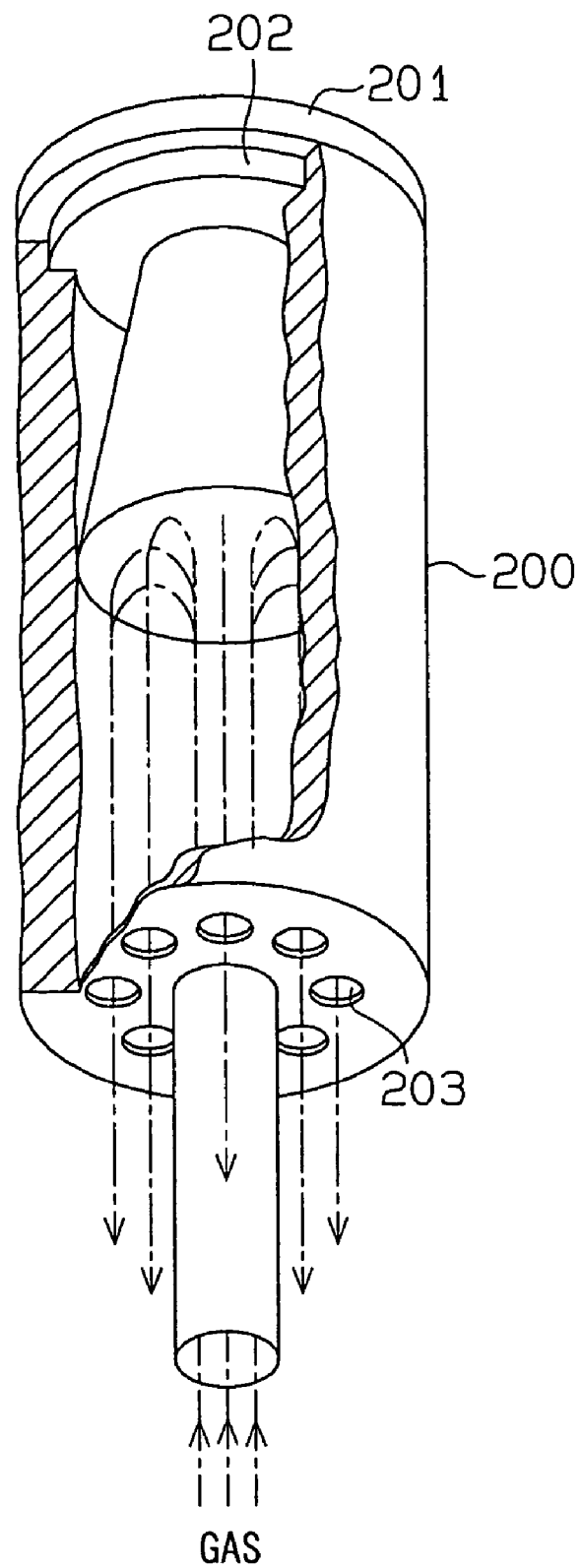
FIG. 21 is a perspective view showing another equipment according to the related art.

In the prior method shown in FIGS. 20 and 21, the raw material gas, which does not contribute to the crystal growth in the susceptor (i.e., a crucible) 101, 200, is discharged to the outside of the susceptor 101, 200. Therefore, an outlet 108, 203 of the susceptor 101, 200 is plugged, so that the continuous crystal growth is disturbed.

To solve the above problem, a comparison method shown in FIGS. 11A–11C is provided. In FIG. 11A, the gas flow is reversed in the reactive chamber 11, and the gas is discharged from the high temperature side of the reactive chamber 11, so that the outlet 508a of the reactive chamber 11 is prevented from being plugged. However, in this comparison method, the raw material gas (i.e., the non-reacted raw material gas), which does not contribute to the crystal growth in the reactive chamber 11, is absorbed in the heat insulation 12. Thus, the silicon carbide poly crystal 522 is separated out, so that the heat insulation performance of the heat insulation 12 is deteriorated. Specifically, as shown in FIG. 1C, in a case where the poly crystal 522 is not deposited (i.e., absorbed) in the heat insulation 12, the temperature in the tube 15 is shown as a solid line in FIG. 11C. However, in a case where the poly crystal 522 is absorbed in the heat insulation 12, the temperature in the tube 15 is shown as a dotted line in FIG. 1C. That is because the poly crystal 522 absorbed in the heat insulation 12 deteriorates the heat insulation performance of the heat insulation 12. When the heat insulation performance of the heat insulation 12 is deteriorated, the temperature distribution is changed as the temperature of the reactive chamber 11 is reduced. In detail, in FIG. 11C, with respect to the temperature distribution at the maximum temperature position, since the poly crystal 522 exists in the absorber 519, the temperature distribution is deviated as the temperature of the tube 15 is reduced. Thus, the crystal growth condition is changed, so that the stable crystal growth is disturbed. Thus, the quality of the crystal may be deteriorated. Further, in an emission path, the poly crystal is separated out so that the emission path is plugged (i.e., blocked). Therefore, the raw material gas supply is stopped, and the continuous crystal growth is disturbed. If the raw material gas is consumed 100% in the reactive chamber 11 at that time, and the non-reacted raw material gas to be discharged to the outside of the reactive chamber 11 disappears (i.e., the consumption yield is 100%), the above problem is avoided. In practice, it is difficult to obtain the 100% consumption yield. Accordingly, it is required to prevent the deterioration of the heat insulation 12 by processing (i.e., absorbing) the non-reacted raw material gas at the outside of the reactive chamber 11.

On the other hand, in this embodiment (i.e., the method shown in FIGS. 8–10) having the absorber 519, the absorber 519 is disposed between the heat insulation 12 and the reactive chamber 11. The absorber 519 is movably supported, and is movable upwardly. Thus, although the silicon carbide poly crystal 522 is separated out in the heat insulation 12 in the comparison method as shown in FIG. 11, the poly crystal 522 is separated out in the absorber 519 in this embodiment, so that the poly crystal 522 is not separated out in the heat insulation 12 substantially. Thus, the heat insulation performance of the heat insulation 12 is not deteriorated, so that the temperature and the temperature distribution of both of the reactive chamber 11 and the tube (i.e., the raw material gas heater vessel) 15 are not changed. Therefore, the crystal growth condition becomes constant so that the quality of the crystal is not deteriorated. Further, the absorber 519 is displaced upwardly at a constant speed, so that the portion, where the silicon carbide poly crystal 522 is separated out, is moved. Therefore, the poly crystal 522 is deposited on the whole area of the absorber 519. Thus, the absorbing amount of the absorber 519 becomes larger, and the crystal growth condition can be kept constant during a sufficiently long time. Thus, the silicon carbide single crystal ingot (21) has a long growth length and high quality. Further, although the silicon carbide poly crystal 522 is separated out in such a narrow portion in the emission path in the comparison method shown in FIG. 11, in the present method, the absorber 519 is displaced so that the emission path is prevented from being plugged. Thus, the raw material is continuously supplied so that the continuous crystal growth is performed.

As described above, the non-reacted raw material gas is limited from being absorbed in the heat insulation 12. Thus, the deterioration of the heat insulation performance of the heat insulation 12 is avoided, so that the crystal growth condition is stabilized. Further, the non-reacted raw material gas is prevented from being cooled and separated out in the gas flow path (specifically the emission path) of the gas discharged from the reactive chamber 11. Thus, the raw material gas is supplied stably. Accordingly, the high quality single crystal is manufactured. Specifically, since the absorber 519 is displaced during the crystal growth so that the portion of the absorber 519 to absorb the non-reacted raw material gas is changed, the portion of the absorber 519 to absorb the non-reacted raw material gas is refreshed. Thus, the absorber 519 has an excellent absorbability. Here, the absorber 519 is displaced in the moving direction, to which the portion of the absorber 519 absorbed the non-reacted raw material gas leaves from the portion of the maximum temperature in the vacuum chamber 10 so that the temperature of the portion of the absorber 519 absorbed the non-reacted raw material gas is lowered. Thus, the absorbed material is prevented from subliming (i.e., vaporizing) again.

Seventh Embodiment

Next, a seventh embodiment of the present invention is described. Specifically, difference between the sixth and the seventh embodiments is described mainly.

FIG. 12A is a schematic cross sectional view showing manufacturing equipment of silicon carbide single crystal, and FIG. 12B is a graph showing a relationship between a position and temperature in the equipment, according to the seventh embodiment.

An absorber 630 is disposed between the heat insulation 12 and the reactive chamber 11. The absorber 630 is movably supported, and is movable downwardly. The absorber 630 is suspended on a support rod 631. The outlet 508a of the reactive chamber 11 for the non-reacted raw material gas is disposed on the lower end of the tube (i.e., the raw material gas heater vessel) 15. The moving velocity of the absorber 630 is in a range between 1 mm/hr and 100 mm/hr. In this embodiment, the absorber 630 is displaced downwardly at a moving velocity of 10 mm/hr during the crystal growth. Thus, the absorber 630 is displaced in the moving direction, to which the portion of the absorber 630 leaves from the portion of the maximum temperature so that the temperature of the portion of the absorber 630 is lowered. Specifically, the moving direction coincides to a direction, to which the portion of the absorber 630 leaves from the arrangement position of the silicon carbide single crystal substrate 13 as the seed crystal through the portion of the maximum temperature in the vacuum chamber 10.

The raw material gas (i.e., the non-reacted raw material gas), which does not contribute to crystal growth, is discharged from the reactive chamber 11 through the outlet 508a. The non-reacted raw material gas is absorbed with the absorber 630, and then the silicon carbide poly crystal 522 is separated out. Thus, the amount of the silicon carbide poly crystal 522 absorbed with the heat insulation 12 is much reduced, so that the deterioration of the heat insulation performance of the heat insulation 12 is avoided. When the heat insulation performance of the heat insulation 12 is constant, the temperature and the temperature distribution of both of the reactive chamber 11 and the tube (i.e., the raw material gas heater vessel) 15 become constant. Thus, the crystal growth condition is not deteriorated with time.

Figure 13:
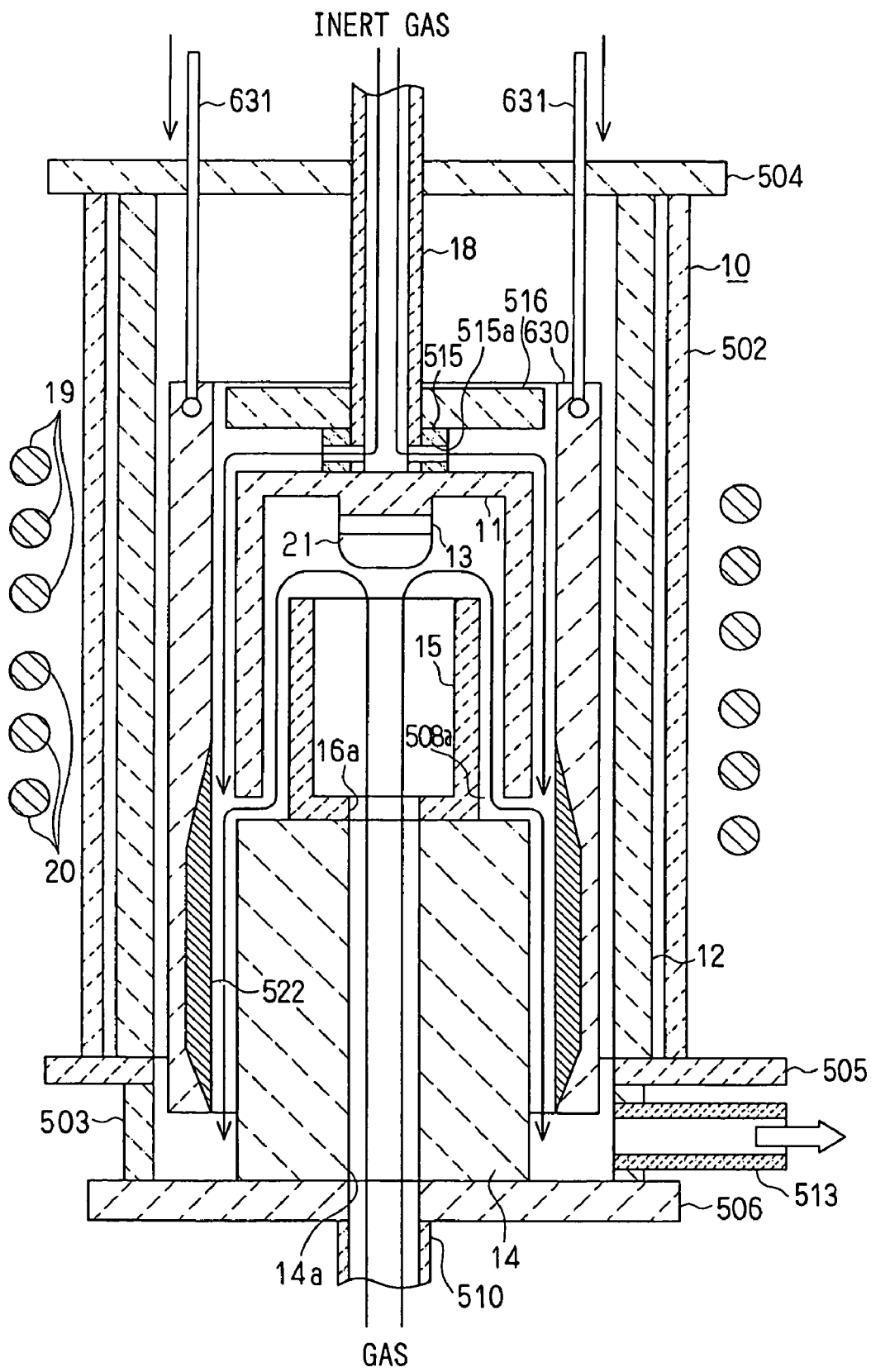
FIG. 13 is a schematic cross sectional view showing the equipment for manufacturing the silicon carbide single crystal during the crystal growth, according to the seventh embodiment.

Further, as shown in FIG. 13, since the absorber 630 is displaced downwardly at a constant speed, the portion where the silicon carbide poly crystal 522 is separated out, is changed so that the poly crystal 522 is deposited on the whole area of the absorber 630. Thus, the absorbing amount becomes larger, so that the crystal growth condition can be kept constant during a sufficiently long time. Therefore, the silicon carbide single crystal ingot (21) has a long growth length and high quality.

Further, as shown in FIG. 12A, the outlet 508a of the reactive chamber 11 for the non-reacted raw material gas is disposed on the lower end of the tube (i.e., the raw material gas heater vessel) 15. Therefore, the portion of the absorber 630, in which the silicon carbide poly crystal 522 is separated out, is disposed under the portion of the maximum temperature of the tube (i.e., the raw material gas heater vessel) 15. Since the absorber 630 is displaced downwardly, the separated silicon carbide poly crystal 522 is always disposed under the reactive chamber 11 and the tube (i.e., the raw material gas heater vessel) 15, and the poly crystal 522 in the absorber 630 is displaced to the low temperature side. Thus, the silicon carbide poly crystal 522 does not sublime again with high temperature, so that the atmosphere in the reactive chamber 11 and the vacuum chamber 10 is not contaminated. Thus, the high quality silicon carbide single crystal ingot (21) can be grown. Further, the silicon carbide poly crystal 522 in the absorber 630 does not affect the temperature distribution in the reactive chamber 11 and the tube (i.e., the raw material gas heater vessel) 15, so that the temperature is controlled much accurately. Accordingly, the absorber 630 is displaced in the moving direction, to which the portion of the absorber 630 leaves from the portion of the maximum temperature so that the temperature of the portion of the absorber 630 is lowered. Specifically, the moving direction coincides to the direction, to which the portion of the absorber 630 leaves from the arrangement position of the silicon carbide single crystal substrate 13 as the seed crystal through the portion of the maximum temperature in the vacuum chamber 10. Therefore, the moving direction of the absorber 630 does not cross the direction leaving from the seed crystal 13. Specifically, the absorber 630 does not cross the growth space and it's around. Therefore, the temperature distribution in the growth space is not affected. Thus, the stable crystal growth condition can be prepared so that the quality of the crystal is improved.

Eighth Embodiment

Next, an eighth embodiment of the present invention is described. Specifically, difference between the sixth and the eighth embodiments is described mainly.

Figure 14A:
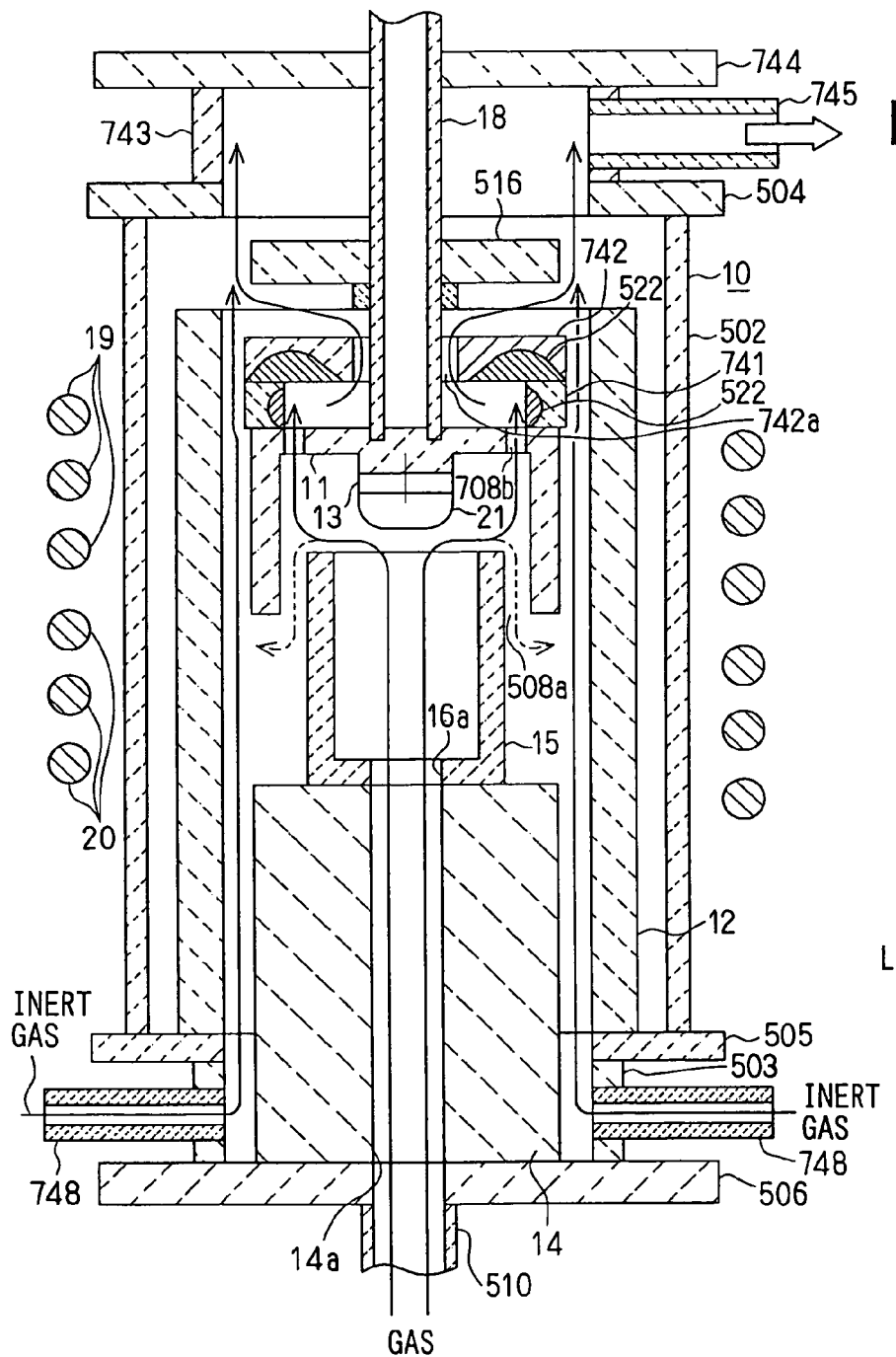
FIG. 14A is a schematic cross sectional view showing equipment for manufacturing a silicon carbide single crystal.
Figure 14B:
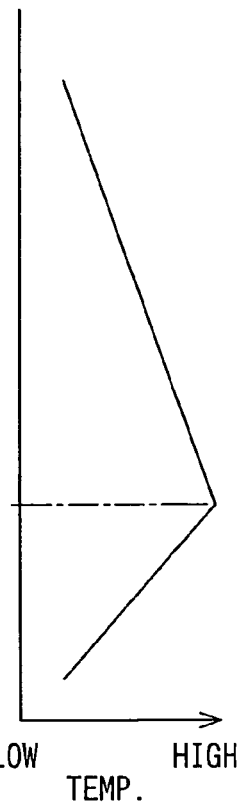
FIG. 14B is a graph showing a relationship between a position and temperature in the equipment, according to an eighth embodiment of the present invention.

FIG. 14A is a schematic cross sectional view showing manufacturing equipment of silicon carbide single crystal, and FIG. 14B is a graph showing a relationship between a position and temperature in the equipment, according to the eighth embodiment.

A through hole (i.e., an emission outlet 708b) is disposed on the top of the reactive chamber 11. Two absorbers 741, 742 are disposed on the top of the reactive chamber 11 so that the absorbers 741, 742 surround the through hole (i.e., the outlet 708b). The pipe 18 penetrates through the absorber 742. A gas flow passage 742a is formed between the pipe 18 and the absorber 742 at a penetration portion of the pipe 18. With respect to the construction of the vacuum chamber 10, a cylinder 743 is disposed on the cylinder 502 through the flange 504. The inside of the cylinder 502 connects to the inside of the cylinder 743. Further, a flange 744 covers the upper opening of the cylinder 743. An emission pipe 745 is formed on the cylinder 743. Thus, the non-reacted raw material gas flows toward the emission pipe 745 through the outlet 708b and the gas flow passage 742a. Accordingly, the raw material gas flows through the reactive chamber 11 in the axial direction of the vacuum chamber 10 having a cylindrical shape. The absorbers 741, 742 are disposed around the outlet 708b of the reactive chamber 11 for the non-reacted raw material gas and disposed outside of the reactive chamber 11. The absorbers 741, 742 absorb the non-reacted raw material gas discharged from the reactive chamber 11 by converting from the gas state to the solid state. The absorbers 741, 742 are made of one of carbon heat insulation, porous carbon, a carbon plate (specifically, a thin plate), a silicon carbide plate (specifically, a thin plate), a tantalum plate (i.e., a thin plate), and a tantalum carbide plate (specifically, a thin plate).

Further, an inert gas introduction pipe 748 is formed on the cylinder 503 disposed on the lower side of the vacuum chamber 10. The inert gas is introduced into the vacuum chamber 10 through the inert gas introduction pipe 748. The introduced inert gas is led to the outer circumference of the tube 15 through the outer circumference of the heat insulation 14. Then, the inert gas flows toward the emission pipe 745 through the outer circumference of the reactive chamber 11.

The raw material gas (i.e., the non-reacted raw material gas), which does not contribute to crystal growth, is discharged from the reactive chamber 11 through the outlet (i.e., the through hole) 708b. The non-reacted raw material gas is absorbed into the absorbers 741, 742 disposed on the top of the reactive chamber 11, so that the silicon carbide poly crystal 522 is separated out. Thus, the amount of the silicon carbide poly crystal 522 absorbed in the heat insulation 516 is much reduced. Therefore, the deterioration of the heat insulation performance of the heat insulation 516 is prevented. When the performance of the heat insulation 516 is constant, the temperature and the temperature distribution of both of the reactive chamber 11 and the tube (i.e., the raw material gas heater vessel) 15 become constant. Thus, the crystal growth condition is not deteriorated with time. Thus, the silicon carbide single crystal ingot (21) has a long growth length and high quality.

Further, since the emission pipe 745 is disposed over the vacuum chamber 10, almost all of the non-reacted raw material gas is discharged from the emission pipe 745 through the outlet (i.e., the through hole) 708b. The amount of the non-reacted raw material gas discharged from the outlet 508a is little, so that the silicon carbide poly crystal separated out in the heat insulation 12 is suppressed to be small amount.

Further, the portion, at which the silicon carbide poly crystal 522 is separated out, is disposed on the upper side of the reactive chamber 11. Therefore, the influence of the silicon carbide poly crystal 522 to the temperature distribution of both of the reactive chamber 11 and the tube (i.e., the raw material gas heater vessel) 15 is reduced. Thus, the temperature is controlled much accurately.

Further, if the outlet (i.e., the through hole) 708b is not plugged with the silicon carbide poly crystal 522, it is not necessarily to equip the outlet 508a. In this case, the clearance between the reactive chamber 11 and the tube (i.e., the raw material gas heater vessel) 15 may be closed, so that the silicon carbide poly crystal 522 is not deposited on the heat insulation 12.

Thus, the raw material gas flows through the reactive chamber 11 in the axial direction of the vacuum chamber 10, and the absorbers 741, 742 are disposed on the outside of the reactive chamber 11 around the outlet 708b of the reactive chamber 11 for the non-reacted raw material gas. Therefore, the dimensions of the absorbers 741, 742 can become smaller. Further, the absorbers 741, 742 are easily exchangeable.

Ninth Embodiment

Next, a ninth embodiment of the present invention is described. Specifically, difference between the sixth and the ninth embodiments is described mainly.

Figure 15A:
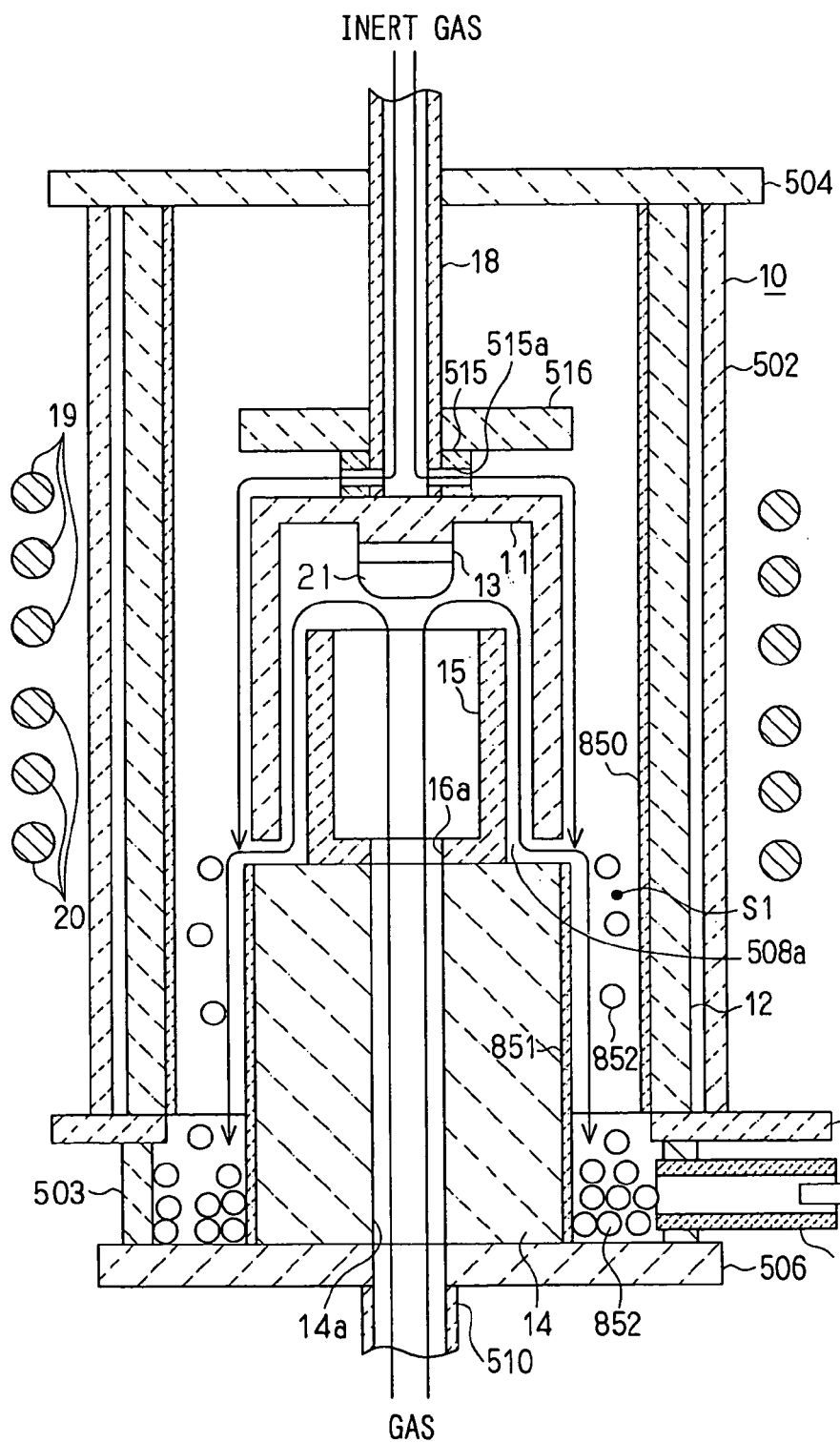
FIG. 15A is a schematic cross sectional view showing equipment for manufacturing a silicon carbide single crystal.
Figure 15B:
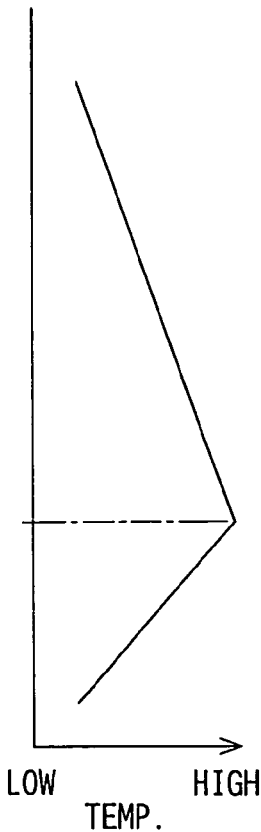
FIG. 15B is a graph showing a relationship between a position and temperature in the equipment, according to a ninth embodiment of the present invention.

FIG. 15A is a schematic cross sectional view showing manufacturing equipment of silicon carbide single crystal, and FIG. 15B is a graph showing a relationship between a position and temperature in the equipment, according to the ninth embodiment.

The outlet 508a of the reactive chamber 11 for the non-reacted raw material gas is disposed on the lower end of the tube (i.e., the raw material gas heater vessel) 15. Thus, the outlet 508a of the reactive chamber 11 for the non-reacted raw material gas is disposed on the emission pipe 513 side disposed in the vacuum chamber 10 from the portion of the maximum temperature in the vacuum chamber 10. Further, a space (i.e., a clearance) S1 is disposed between the heat insulations 12, 14 to separate therebetween. Specifically, the space S1 is disposed on a place, temperature of which is gradually reduced, and the space S1 is surrounded by the heat insulations 12, 14 disposed in the gas flow path in the vacuum chamber 10 from the outlet 508a of the reactive chamber 11 for the non-reacted raw material gas to the emission pipe 513 in the vacuum chamber 10 for the non-reacted raw material gas. The non-reacted raw material gas component is separated out in the space S1. With respect to the space S1, the space (i.e., the clearance) S1 is defined as a distance between the heat insulations 12, 14. In detail, the space S1 is equal to or larger than 5 mm. Further, a distance between the heat insulation 12 and the reactive chamber 11 is equal to or larger than 5 mm. When the space S1 is set to be equal to or larger than 5 mm, the space S1 is prevented from being plugged.

Further, an air-tight sheet 850 is disposed on the inner circumference of the heat insulation 12. Another air-tight sheet 851 is disposed on the outer circumference of the heat insulation 14. Therefore, the air-tight sheets 50, 51 are disposed on the surfaces of the heat insulations 12, 14, respectively. Here, the heat insulations 12, 14 provide the space S1 for separating out the non-reacted raw material gas component. The air-tight sheets 50, 51 are made of graphite, tantalum, or tantalum carbide.

Further, the inert gas flows in the space S1 for separating out the non-reacted raw material gas component. Specifically, the inert gas flows from the upper side to the lower side, i.e., the inert gas flows toward the emission pipe 513 of the vacuum chamber 10 (i.e., the inert gas flows through the space S1 from the upper side). Thus, the inert gas is mixed with the non-reacted raw material gas so that the inert gas is discharged from the emission pipe 513 disposed on the lower side. Further, the inside of the cylinder 503 disposed on the lower side of the vacuum chamber 10 provides an accumulator for accumulating the deposited material. An emission pump (not shown) is connected to the emission pipe 513 through a filter (not shown).

The raw material gas (i.e., the non-reacted material gas), which does not contribute to crystal growth, is discharged from the inside of the reactive chamber 11 through the outlet 508a. The temperature of the non-reacted raw material gas is lowered in the space (i.e., the clearance) S1, so that degree of super saturation of the gas is reduced. Therefore, a solid-state particle 852 is separated out from the gas. The solid-state particle 852 is accumulated in the lower side of the vacuum chamber 10 by the emission gas flow and the gravity. A part of the solid-state particle 852 is discharged to the outside through the emission pipe 513 so that the part of the solid-state particle 852 is captured by a filter (not shown). Further, the inert gas such as an argon gas flows through the space S1 so that the inert gas is mixed with the non-reacted raw material gas. Thus, it is promoted to separate out the solid-state particle 852. In detail, the inert gas is mixed with the non-reacted raw material gas so that the concentration of the non-reacted raw material gas is reduced. Therefore, the solid-state particle 852 is separated out easily.

Further, the non-reacted raw material gas does not pass through the air-tight sheets 50, 51 disposed on the outside of the lower heat insulation 14 and disposed on the inside of the side heat insulation 12, respectively. Therefore, the silicon carbide poly crystal is prevented from being deposited on the side heat insulation 12 and the lower heat insulation 14. Further, the deterioration of the heat insulation performance accompanying the deposition of the poly crystal is prevented. When the performance of the side heat insulation 12 is constant, the temperature and the temperature distribution of both of the reactive chamber 11 and the tube (i.e., the raw material gas heater vessel) 15 become constant. Therefore, the crystal growth condition is not deteriorated with time. Thus, the silicon carbide single crystal ingot (21) has a long growth length and high quality.

Accordingly, the temperature of the non-reacted raw material gas discharged from the reactive chamber 11 is gradually reduced in the space S1 disposed in the gas flow path and surrounded by the heat insulations 12, 14, which are disposed downstream side from the outlet 508a of the reactive chamber 11 for the non-reacted raw material gas. Then, the non-reacted raw material gas component is separated out. Further, since the inert gas flows through the space S1 toward the emission pipe 513, the deposited material is easily discharged. Furthermore, the air-tight sheets 50, 51 prevent the non-reacted raw material gas from contacting the heat insulations 12, 14, so that the poly crystal is prevented from being deposited on the heat insulations 12, 14.

Tenth Embodiment

Next, a tenth embodiment of the present invention is described. Specifically, difference between the ninth and the tenth embodiments is described mainly.

FIG. 16A is a schematic cross sectional view showing manufacturing equipment of silicon carbide single crystal, and FIG. 16B is a graph showing a relationship between a position and temperature in the equipment, according to the tenth embodiment.

A crystal core is disposed in the inert gas flow path disposed between the top of the reactive chamber 11 and the bottom of the heat insulation 516. Specifically, the crystal core is disposed in a chamber 960 covered with a cover 961. The inert gas flows through the chamber 960 and the cover 961, so that the crystal core is spread in the space (i.e., the clearance) S1. Specifically, the crystal core is mixed in the inert gas, and then the inert gas is spread in the space S1 for separating out the non-reacted raw material gas component. The cover 961 is made of a part having a through hole or a part having a mesh construction.

The raw material gas (i.e., the non-reacted raw material gas), which does not contribute to the crystal growth, is discharged from the inside of the reactive chamber 11 through the outlet 508a. The non-reacted raw material gas component is separated out as a solid-state particle 852 in the space S1. At this time, the crystal core, which is spread in the space S1 by the inert gas flow, works as a core of the solid-state particle 852 so that it is promoted to separate out the solid-state particle 852 (i.e., the non-reacted raw material gas component is easily separated out).

The separated solid-state particle 852 is carried by the emission gas flow and the gravity so that the solid-state particle 852 is accumulated under the vacuum chamber 10. A part of the solid-state particle 852 is discharged to the outside through the emission pipe 513. Then, the part of the solid-state particle is captured with the filter (not shown). Accordingly, the silicon carbide poly crystal is prevented from being separated out in the side heat insulation 12, and the deterioration of the heat insulation performance is prevented. When the performance of the side heat insulation 12 is constant, the temperature and the temperature distribution of both of the reactive chamber 11 and the tube (i.e., the raw material gas heater vessel) 15 become constant. Therefore, the crystal growth condition is not deteriorated with time. Accordingly, the silicon carbide single crystal ingot (21) has a long growth length and high quality.

The crystal core in the chamber 960 is made of a fine powder having high temperature melting point such as silicon carbide, tantalum, tantalum carbide, and carbon. Preferably, the solid-state particle size of the crystal core is equal to or smaller than 1 µm.

Eleventh Embodiment

Next, an eleventh embodiment of the present invention is described. Specifically, difference between the ninth and the eleventh embodiments is described mainly.

FIG. 17A is a schematic cross sectional view showing manufacturing equipment of silicon carbide single crystal, and FIG. 17B is a graph showing a relationship between a position and temperature in the equipment, according to the tenth embodiment.

The outlet 508a of the reactive chamber 11 for the non-reacted raw material gas is disposed on the upper half of the tube 15. Specifically, the gas flow path in the vacuum chamber 10 from the outlet 508a of the reactive chamber 11 for the non-reacted raw material gas to the emission pipe 513 for the non-reacted raw material gas disposed in the vacuum chamber 10 passes through the portion of the maximum temperature in the vacuum chamber 10. Further, a heat insulation 1070 is disposed on a portion of the tube (i.e., a raw material gas heater vessel) 15, which exposes in the gas flow path from the outlet 508a of the reactive chamber 11 for the non-reacted raw material gas to the space S1 for separating out the non-reacted raw material gas component. In detail, the heat insulation 1070 is disposed to adhere to the outer circumference of the tube (i.e., the raw material gas heater vessel) 15. Further, another heat insulation 1071 is disposed to adhere to the outer circumference of the reactive chamber 11. The inert gas flows through the space S1 from the upper side, and then the inert gas is mixed with the non-reacted raw material gas. After that, the inert gas is discharged from the emission pipe 513 disposed on the lower side. The distance between the side heat insulation 12 and the heat insulation 1071, the distance between the side heat insulation 12 and the heat insulation 1070, and the distance between the side heat insulation 12 and the lower heat insulation 14 are equal to or larger than 5 mm, respectively.

The raw material gas (i.e., the non-reacted raw material gas), which does not contribute to the crystal growth, is discharged from the inside of the reactive chamber 11 through the outlet 508a. The non-reacted raw material gas component is separated out as a solid-state particle 852 in the space S1. The solid-state particle 852 is accumulated in the lower side of the vacuum chamber 10 by the emission gas flow and the gravity. A part of the solid-state particle 852 is discharged to the outside through the emission pipe 513, and then the solid-state particle 852 is captured with the filter (not shown). The inert gas such as an argon gas flows through the space S1, so that the inert gas is mixed with the non-reacted raw material gas. Thus, it is promoted to separate out the solid-state particle 852.

Further, as shown in the temperature distribution on line XVIIC—XVIIC in FIG. 17, the heat insulations 1070, 1071 are disposed to adhere to the outer circumferences of the tube (i.e., the raw material gas heater vessel) 15 and the reactive chamber 11, respectively, so that the temperatures of the outer circumference sides of them are reduced. Therefore, it is promoted to separate out the solid-state particle 852. When the performance of the heat insulation 12 is constant, the temperature and the temperature distribution of both of the reactive chamber 11 and the tube (i.e., the raw material gas heater vessel) 15 become constant. Thus, the crystal growth condition is not deteriorated with time. Therefore, the silicon carbide single crystal ingot (21) has a long growth length and high quality. Here, it is not necessarily to equip the heat insulation 1071.

Twelfth Embodiment

Next, a twelfth embodiment of the present invention is described. Specifically, difference between the sixth and the twelfth embodiments is described mainly.

Figure 18A:
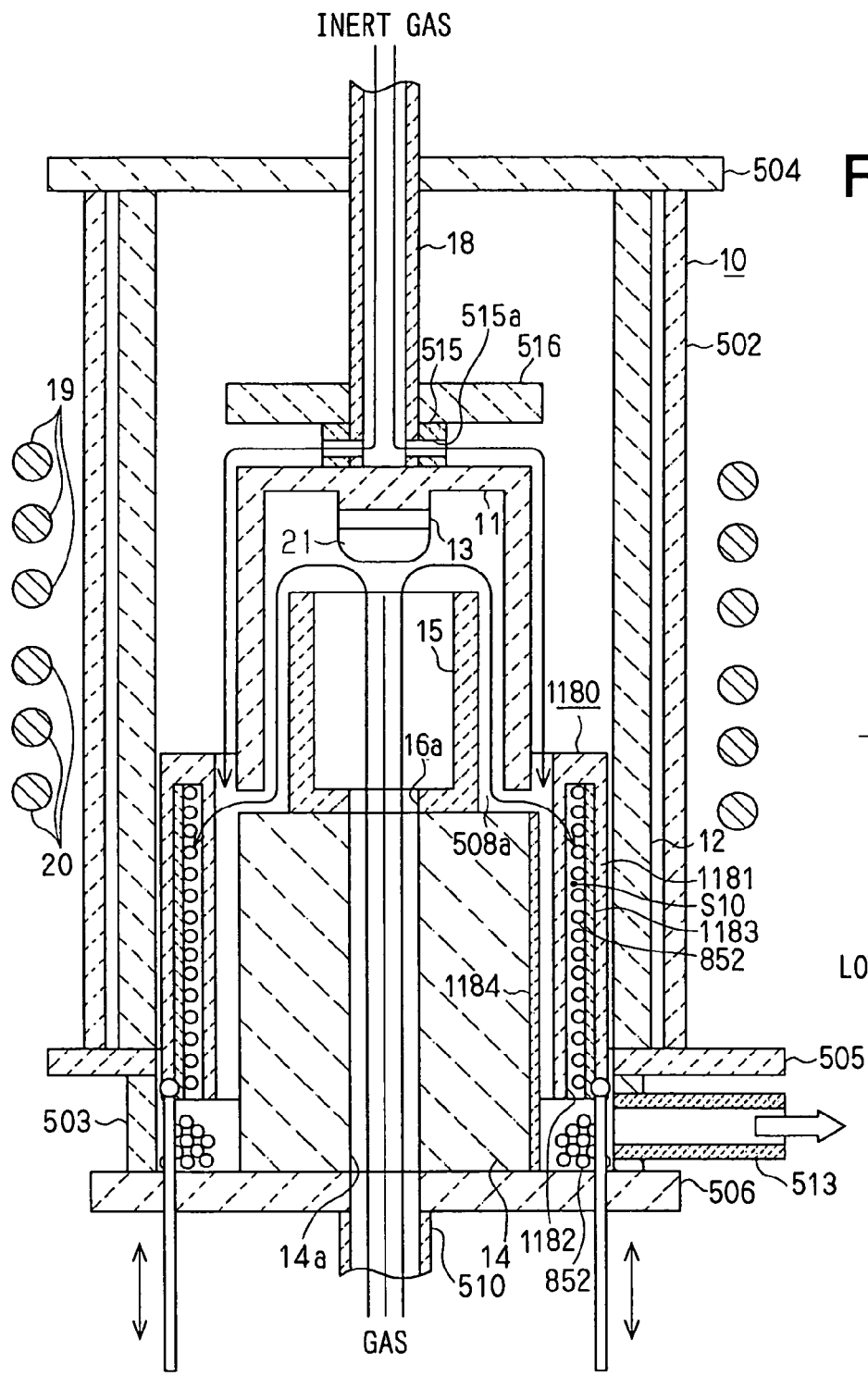
FIG. 18A is a schematic cross sectional view showing equipment for manufacturing a silicon carbide single crystal.
Figure 18B:
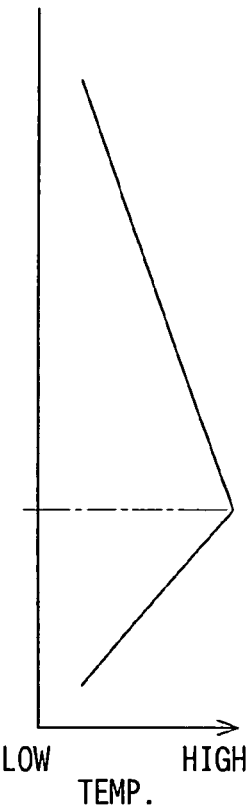
FIG. 18B is a graph showing a relationship between a position and temperature in the equipment, according to a twelfth embodiment of the present invention.

FIG. 18A is a schematic cross sectional view showing manufacturing equipment of silicon carbide single crystal, and FIG. 18B is a graph showing a relationship between a position and temperature in the equipment, according to the eleventh embodiment.

Figure 19A:
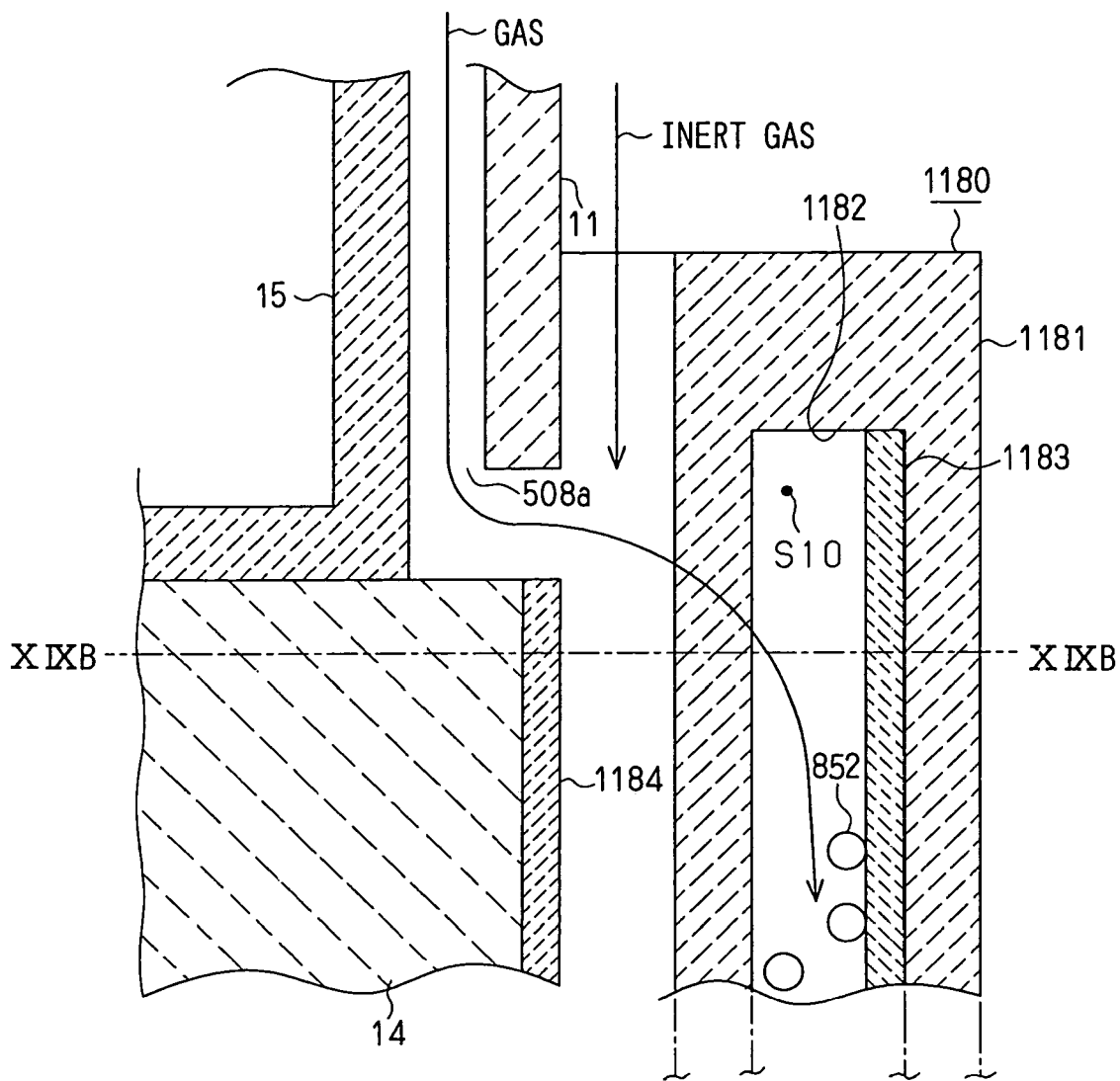
FIG. 19A is a partially enlarged cross sectional view showing the equipment.
Figure 19B:
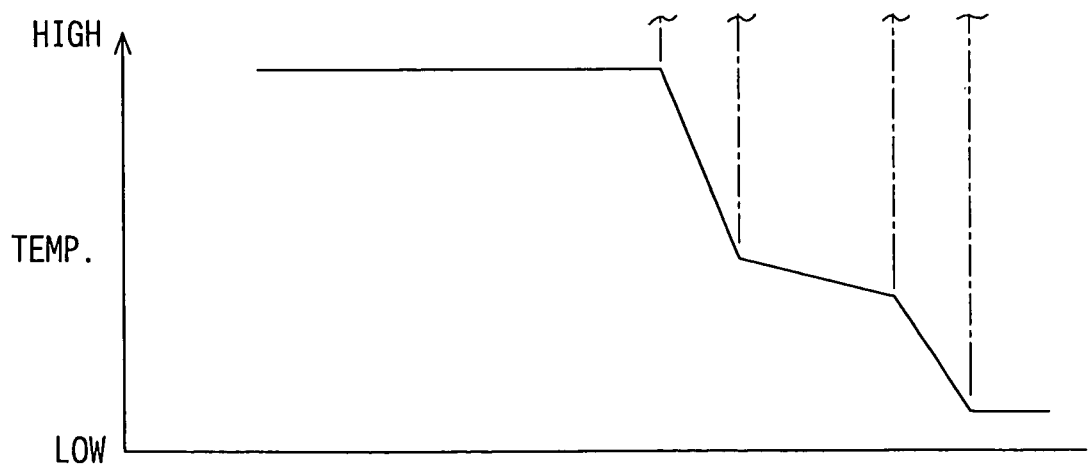
FIG. 19B is a graph showing a temperature profile disposed on line XIXB—XIXB in FIG. 19A, according to the twelfth embodiment.

The outlet 508a of the reactive chamber 11 for the non-reacted raw material gas is disposed on the lower end of the tube (i.e., the raw material gas heater vessel) 15. Therefore, the outlet 508a of the reactive chamber 11 for the non-reacted raw material gas is disposed on the emission pipe 513 side in the vacuum chamber 10 from the portion of the maximum temperature in the vacuum chamber 10. A separator 1180 for separating out the non-reacted raw material gas component is disposed on a part of a gas flow path in the vacuum chamber 10 disposed from an outlet 508a of the reactive chamber 11 for the non-reacted raw material gas to the emission pipe 513 in the vacuum chamber 10 for the non-reacted raw material gas. The temperature of the part of the gas flow path is gradually reduced. The separator 1180 for separating out the non-reacted raw material gas component has a cylindrical shape. Specifically, the separator 1180 for separating out the non-reacted raw material gas component is disposed between the side heat insulation 12 and the lower side of the reactive chamber 11, and is disposed between the side heat insulation 12 and the lower heat insulation 14. FIG. 19A is an enlarged view showing the separator 1180, and FIG. 19B is a graph showing a temperature profile disposed on line XIXB—XIXB in FIG. 19A. The separator 1180 is composed of a heat insulation 1181 having a cylindrical shape. The heat insulation 1181 includes a groove 1182, which opens to the lower end. The inside of the groove 1182 provides a space (i.e., a clearance) S10. The non-reacted raw material gas component is separated out in the space (i.e., the clearance) S10 surrounded by the heat insulation 1181 in the separator 1180. An air-tight sheet 1183 is disposed on the outer circumference of the groove 1182. Specifically, the separator 1180 includes the air-tight sheet 1183 disposed on the outer circumference of the space S10 surrounded by the heat insulation 1181.

A vibration is applied to the separator 1180 from the outside. Further, another air-tight sheet 1184 is disposed on the outer circumference of the heat insulation 14.

The raw material gas (i.e., the non-reacted raw material gas), which does not contribute to the crystal growth, is discharged from the inside of the reactive chamber 11 through the outlet 508a. The non-reactive raw material gas component is separated out as a solid-state particle 852 in the separator 1180.

The created solid-state particle 852 is accumulated in the lower side of the vacuum chamber 10 by the emission gas flow and the gravity. A part of the solid-state particle 852 is discharged to the outside through the emission pipe 513. Then, the part of the solid-state particle 852 is captured with a filter (not shown).

Further, since the separator 1180 is vibrated, it is promoted to drop the solid-state particle 852 down. Thus, the silicon carbide poly crystal is prevented from being separated out in the side heat insulation 12. Further, the deterioration of the heat insulation performance is prevented. When the performance of the side heat insulation 12 is constant, the temperature and the temperature distribution of both of the reactive chamber 11 and the tube (i.e., the raw material gas heater vessel) 15 become constant. Thus, the crystal growth condition is not deteriorated with time. Thus, the silicon carbide single crystal ingot (21) has a long growth length and high quality.

A mechanism to create the solid-state particle 852 and an emission of the solid-state particle 852 are described as follows with reference to FIGS. 19A and 19B. The non-reacted raw material gas flows from the inner wall of the separator 1180 to the inside of the separator 1180 (i.e., in the groove 1182) through the heat insulation 1181. At that time, the temperature of the gas is rapidly reduced, so that the solid-state particle 852 is created in the space (i.e., the clearance) S10. A part of the solid-state particle 852 created in the separator 1180 adheres to the surface of the air-tight sheet 1183. Since the separator 1180 is vibrated, the adhered solid-state particle 852 is dropped down so that the space S10 is prevented from being plugged. Further, the air-tight sheet 1183 is disposed on the heat insulation 1181 in the space S10. Therefore, the non-reacted raw material gas does not reach the side heat insulation 12, so that the silicon carbide poly crystal is not separated out in the side heat insulation 12. Thus, the deterioration of the heat insulation performance is prevented. Specifically, the air-tight sheet 1183 prevents the non-reacted raw material gas from contacting the heat insulation 12 disposed around the reactive chamber 11. Therefore, the poly crystal is prevented from being separated out in the heat insulation 12.

Thus, the separator 1180 for separating out the non-reacted raw material gas component (i.e., the particle generator) is prepared so that the non-reacted raw material gas component is separated out in the space S10 surrounded by the heat insulation 1181 in the separator 1180. Accordingly, the temperature of the non-reacted raw material gas discharged from the reactive chamber 11 is gradually reduced in the space S10 so that the non-reacted raw material gas component is separated out. Here, the space S10 is surrounded by the heat insulation 1181 in the separator 1180 disposed on the downstream side from the outlet 508a of the reactive chamber 11 for the non-reacted raw material gas in the gas flow path. Further, the air-tight sheet 1183 prevents the non-reacted raw material gas from contacting the heat insulation 12, so that the poly crystal is prevented from being separated out in the heat insulation 12. Furthermore, the separator 1180 is capable of vibrating so that the deposited material is swept down.

Such changes and modifications are to be understood as being within the scope of the present invention as defined by the appended claims.

What is claimed is:

1. A method for manufacturing a silicon carbide single crystal, the method comprising the steps of:
   setting a silicon carbide single crystal substrate as a seed crystal in a reactive chamber;
   introducing a raw material gas including a silicon containing gas and a carbon containing gas into the reactive chamber;
   growing a silicon carbide single crystal from the silicon carbide single crystal substrate;
   heating the raw material gas at an upstream side from the silicon carbide single crystal substrate in a gas flow path;
   keeping a temperature of the silicon carbide single crystal substrate at a predetermined temperature lower than the raw material gas so that the silicon carbide single crystal is grown from the silicon carbide single crystal substrate;
   heating a part of the raw material gas, which is a non-reacted raw material gas and does not contribute to crystal growth, after passing through the silicon carbide single crystal substrate; and
   absorbing a non-reacted raw material gas component in the non-reacted raw material gas with an absorber.

2. The method according to claim 1,
   wherein the raw material gas is heated at a temperature in a range between 2300° C. and 2700° C. in the step of heating the raw material gas at the upstream side, and
   wherein the silicon carbide single crystal has a temperature of a growth surface in a range between 2100° C. and 2600° C.

3. The method according to claim 1,
   wherein the part of the raw material gas has a second gas flow opposite to a first gas flow of the raw material gas flowing toward the silicon carbide single crystal substrate.

4. The method according to claim 1,
   wherein the temperature of the silicon carbide single crystal substrate is lowered to be lower than temperature around the silicon carbide single crystal substrate.

5. The method according to claim 1, further comprising the step of:
   stirring the raw material gas in the step of heating the raw material gas at the upstream side before the raw material gas is introduced to the silicon carbide single crystal substrate.

6. The method according to claim 1, further comprising the step of:
   discharging the part of the raw material gas without including silicon and carbon.

7. A method for manufacturing a silicon carbide single crystal, the method comprising the steps of:
   mounting a reactive chamber in a vacuum chamber in such a manner that the reactive chamber is surrounded by a heat insulation of the vacuum chamber;
   setting a silicon carbide single crystal substrate as a seed crystal in the reactive chamber;
   introducing a raw material gas including a silicon containing gas and a carbon containing gas into the reactive chamber;
   growing a silicon carbide single crystal from the silicon carbide single crystal substrate;
   discharging a part of the raw material gas, which is a non-reacted raw material gas and does not contribute to crystal growth, after passing through the silicon carbide single crystal substrate; and
   removing a non-reacted raw material gas component in the non-reacted raw material gas in such a manner that the non-reacted raw material gas component is converted from a gas state to a solid state in the vacuum chamber before the non-reacted raw material gas component is absorbed in the heat insulation.

8. Equipment for manufacturing a silicon carbide single crystal, the equipment comprising:
   a reactive chamber for accommodating a silicon carbide single crystal substrate as a seed crystal, wherein a raw material gas including a silicon containing gas and a carbon containing gas is introduced into the reactive chamber so that a silicon carbide single crystal is grown from the silicon carbide single crystal substrate;
   a heater for heating the raw material gas to be introduced to the silicon carbide single crystal substrate up to a temperature higher than a temperature of the silicon carbide single crystal substrate; and
   an absorber,
   wherein the reactive chamber has a construction in such a manner that a part of the raw material gas, which is a non-reacted raw material gas and does not contribute to crystal growth, flows toward a downstream side from the silicon carbide single crystal substrate after passing through the silicon carbide single crystal substrate,
   wherein the heater heats the part of the raw material gas after passing through the silicon carbide single crystal substrate, and
   wherein the absorber absorbs a non-reacted raw material gas component in the non-reacted raw material gas after heating the part of the raw material gas.

9. The equipment according to claim 8,
   wherein the reactive chamber has a predetermined temperature gradient in such a manner that a temperature in the reactive chamber is reduced as it goes toward the silicon carbide single crystal substrate.

10. The equipment according to claim 8,
    wherein the non-reacted raw material gas is discharged along with an inner wall of the reactive chamber after passing through the silicon carbide single crystal substrate.

11. The equipment according to claim 8,
wherein the reactive chamber is a cylinder having a cover,
wherein the raw material gas is introduced from an opening of the reactive chamber into a middle portion of the reactive chamber so that the raw material gas is led to the silicon carbide single crystal substrate,
wherein the raw material gas changes its flowing direction reversely after the raw material gas reaches the silicon carbide single crystal substrate, and
wherein the non-reacted raw material gas flows from the opening of the reactive chamber to the downstream side along with the inner wall of the reactive chamber.

12. The equipment according to claim 8, further comprising:
a tube for introducing the raw material gas toward the reactive chamber,
wherein the reactive chamber is separated from the tube.

13. The equipment according to claim 12,
wherein the tube has an upper opening, which is disposed in a middle portion of the reactive chamber.

14. The equipment according to claim 13,
wherein the silicon carbide single crystal substrate is movably supported in the reactive chamber, and
wherein the silicon carbide single crystal substrate is movable toward and against the tube.

15. The equipment according to claim 14,
wherein the tube has an outer circumference, which is separated from an inner wall of the reactive chamber.

16. The equipment according to claim 15,
wherein the upper opening of the tube is apart from a growth surface of the silicon carbide single crystal by a predetermined distance, and
wherein the distance is equal to or smaller than 20 mm.

17. The equipment according to claim 16,
wherein the distance between the growth surface of the silicon carbide single crystal and the upper opening of the tube is equal to or smaller than 5 mm.

18. The equipment according to claim 8, further comprising:
a heat insulation disposed around the silicon carbide single crystal substrate.

19. The equipment according to claim 8, further comprising:
a coolant gas pipe for introducing a coolant gas in order to exchange heat between the coolant gas and the reactive chamber so that temperature of the silicon carbide single crystal substrate is lowered to be lower than temperature around the silicon carbide single crystal substrate.

20. The equipment according to claim 8,
wherein the heater includes a plate having a plurality of through holes,
wherein the plate is disposed in a gas flow path, and
wherein the raw material gas flows through the through holes of the plate so that the raw material gas is stirred.

21. The equipment according to claim 8,
wherein the absorber is made of porous carbon, carbon felt or carbon heat insulation.

22. The equipment according to claim 8, further comprising:
a hydrogen separation film disposed on an outlet of the reactive chamber,
wherein the hydrogen separation film passes a hydrogen gas only.

23. The equipment according to claim 8,
wherein the reactive chamber includes a cylinder and a base, and
wherein the base supports the silicon carbide single crystal substrate, and is movable in the cylinder.

24. Equipment for manufacturing a silicon carbide single crystal, the equipment comprising:
a reactive chamber disposed in a vacuum chamber;
a heat insulation for surrounding the reactive chamber;
a silicon carbide single crystal substrate as a seed crystal disposed in the reactive chamber;
a tube for introducing a raw material gas including a silicon containing gas and a carbon containing gas into the reactive chamber so that a silicon carbide single crystal is grown from the silicon carbide single crystal substrate; and
an absorber disposed between an outlet of the reactive chamber and a heat insulation of the vacuum chamber,
wherein a non-reacted raw material gas component in a non-reacted raw material gas, which does not contribute to crystal growth, is converted from a gas state to a solid state so that the non-reacted raw material gas component is absorbed in the absorber.

25. The equipment according to claim 24,
wherein the absorber is displaced during crystal growth so that a portion of the absorber for absorbing the non-reacted raw material gas component is changed.

26. The equipment according to claim 25, further comprising:
a heater for heating the raw material gas to be introduced into the reactive chamber,
wherein the raw material gas is heated up to a maximum temperature before introducing into the reactive chamber,
wherein the silicon carbide single crystal substrate has a temperature lower than the maximum temperature so that the silicon carbide single crystal is grown from the silicon carbide single crystal substrate, and
wherein the absorber is displaced in a moving direction, to which a portion of the absorber absorbed the non-reacted raw material gas component leaves from a portion of the maximum temperature in the vacuum chamber so that a temperature of the portion of the absorber is lowered.

27. The equipment according to claim 26,
wherein the moving direction of the absorber is a direction, to which the portion of the absorber absorbed the non-reacted raw material gas component leaves from the silicon carbide single crystal substrate through the portion of the maximum temperature in the vacuum chamber.

28. The equipment according to claim 25,
wherein the absorber has a moving velocity in a range between 1 mm/hr and 100 mm/hr.

29. The equipment according to claim 24, further comprising:
another absorber disposed outside of the reactive chamber,
wherein the reactive chamber has an emission outlet for discharging the non-reacted raw material gas,
wherein the other absorber is disposed around the emission outlet,
wherein the raw material gas flows into the reactive chamber in an axial direction of the vacuum chamber having a cylindrical shape, and
wherein the non-reacted raw material gas component in the non-reacted raw material gas discharged from the reactive chamber is converted from a gas state to a solid state so that the non-reacted raw material gas component is absorbed in the other absorber.

30. The equipment according to claim 24,
wherein the absorber is made of carbon heat insulation, porous carbon, carbon plate, silicon carbide, tantalum plate, or tantalum carbide plate.

31. Equipment for manufacturing a silicon carbide single crystal, the equipment comprising:
a reactive chamber disposed in a vacuum chamber;
a heat insulation for surrounding the reactive chamber;
a silicon carbide single crystal substrate as a seed crystal disposed in the reactive chamber;
a tube for introducing a raw material gas including a silicon containing gas and a carbon containing gas into the reactive chamber so that a silicon carbide single crystal is grown from the silicon carbide single crystal substrate;
a space for separating out a non-reacted raw material gas component in a non-reacted raw material gas, which does not contribute crystal growth,
wherein the space is disposed in a place, temperature of which is gradually reduced, and
wherein the space is surrounded by the heat insulation disposed in a gas flow path in the vacuum chamber, the gas flow path being disposed from an outlet of the reactive chamber to an emission pipe in the vacuum chamber for discharging the non-reacted raw material gas.

32. The equipment according to claim 31,
wherein the outlet of the reactive chamber is disposed on a side of the emission pipe in the vacuum chamber from a portion of a maximum temperature in the vacuum chamber.

33. The equipment according to claim 31,
wherein the gas flow path in the vacuum chamber from the outlet of the reactive chamber to the emission pipe in the vacuum chamber passes through the portion of the maximum temperature in the vacuum chamber, and
wherein the tube includes another heat insulation, which is exposed in the gas flow path from the outlet of the reactive chamber to the space.

34. The equipment according to claim 31, further comprising:
an inert gas pipe for introducing an inert gas toward the emission pipe in the vacuum chamber.

35. The equipment according to claim 34,
wherein the inert gas including a crystal core is spread in the space.

36. The equipment according to claim 35,
wherein the crystal core is a fine powder made of material having a high melting point.

37. The equipment according to claim 36,
wherein the material having the high melting point is silicon carbide, tantalum, tantalum carbide or carbon.

38. The equipment according to claim 31,
wherein the heat insulation for surrounding the space includes an air-tight sheet disposed on a surface of the heat insulation.

39. The equipment according to claim 38,
wherein the air-tight sheet is made of graphite, tantalum or tantalum carbide.

40. Equipment for manufacturing a silicon carbide single crystal, the equipment comprising:
a reactive chamber disposed in a vacuum chamber;
a heat insulation for surrounding the reactive chamber;
a silicon carbide single crystal substrate as a seed crystal disposed in the reactive chamber;
a tube for introducing a raw material gas including a silicon containing gas and a carbon containing gas into the reactive chamber so that a silicon carbide single crystal is grown from the silicon carbide single crystal substrate; and
a separator for separating out a non-reacted raw material gas component in a non-reacted raw material gas, which does not contribute to crystal growth,
wherein the separator is disposed in a part of a gas flow path in the vacuum chamber, the part of the gas flow path being disposed from an outlet of the reactive chamber to an emission pipe in the vacuum chamber,
wherein the emission pipe discharges the non-reacted raw material gas,
wherein the part of the gas flow path has a temperature being gradually reduced, and
wherein the non-reacted raw material gas component in the non-reacted raw material gas is separated out in a space surrounded by another heat insulation in the separator.

41. The equipment according to claim 40,
wherein the separator includes an air-tight sheet disposed on an inner circumference of the space.

42. The equipment according to claim 40,
wherein the separator is capable of vibrating.

* * * * *